(12) United States Patent
Jung et al.

(10) Patent No.: US 12,745,358 B2
(45) Date of Patent: Sep. 22, 2026

(54) HOUSING COMPRISING PLATING LAYER AND ELECTRONIC DEVICE COMPRISING HOUSING

(71) Applicants: Samsung Electronics Co., Ltd., Suwon-si (KR); INTOPS. CO., LTD., Anyang-si (KR)

(72) Inventors: Chunghyo Jung, Suwon-si (KR); Chiyoung Yoon, Anyang-si (KR)

(73) Assignees: SAMSUNG ELECTRONICS CO., LTD., Suwon-si (KR); INTOPS CO., LTD, Anyang-si (KR)

( * ) Notice: Subject to any disclaimer, the term of this patent is extended or adjusted under 35 U.S.C. 154(b) by 353 days.

(21) Appl. No.: 18/473,559

(22) Filed: Sep. 25, 2023

(65) Prior Publication Data

US 2024/0015910 A1 Jan. 11, 2024

Related U.S. Application Data

(63) Continuation of application No. PCT/KR2022/004051, filed on Mar. 23, 2022.

(30) Foreign Application Priority Data

Mar. 26, 2023 (KR) ........................ 10-2021-0039524

(51) Int. Cl.
*H05K 5/02* (2006.01)
*H04M 1/02* (2006.01)
(Continued)

(52) U.S. Cl.
CPC ........ *H05K 5/0243* (2013.01); *H04M 1/0202* (2013.01); *H05K 5/0018* (2022.08);
(Continued)

(58) Field of Classification Search
CPC ...... H05K 5/0243; H05K 5/04; H05K 5/0018; H05K 5/0086; H04M 1/026; H04M 1/0202
See application file for complete search history.

(56) References Cited

U.S. PATENT DOCUMENTS 6,015,520 A 1/2000 Appelt et al.
6,265,671 B1 7/2001 Matsuno
(Continued)

FOREIGN PATENT DOCUMENTS

CN 1172414 2/1998
CN 102610898 7/2012
(Continued)

OTHER PUBLICATIONS

Machine Translation of KR 10-2015-0115586 A. (Year: 2015).*
(Continued)

*Primary Examiner* — Brian Handville
(74) *Attorney, Agent, or Firm* — Nixon & Vanderhye, P.C.

(57) ABSTRACT

An example housing of an electronic device may include a body including a first portion having a first curvature, and a second portion having a second curvature; an outer plating layer comprising a conductive material and disposed on an outer surface of the body unit to be spaced by a predetermined interval from a boundary between the first portion and the second portion; and a coating layer which is disposed on the outer surface of the body to cover the plating layer.

14 Claims, 31 Drawing Sheets

(51) Int. Cl.
*H05K 5/00* (2006.01)
*H05K 5/04* (2006.01)

(52) U.S. Cl.
CPC ............. *H05K 5/0086* (2013.01); *H05K 5/04* (2013.01); *H04M 1/026* (2013.01)

(56) References Cited

U.S. PATENT DOCUMENTS

| | | | | |
|---|---|---|---|---|
| 10,109,908 | B2 | 10/2018 | Youm et al. | |
| 10,545,611 | B2 | 1/2020 | Kwon et al. | |
| 11,405,540 | B2 | 8/2022 | Lee et al. | |
| 2002/0005359 | A1 | 1/2002 | Hongo et al. | |
| 2002/0011417 | A1 | 1/2002 | Talieh et al. | |
| 2002/0184757 | A1 | 12/2002 | Lee et al. | |
| 2011/0021255 | A1 | 1/2011 | Kim et al. | |
| 2011/0317343 | A1 | 12/2011 | Shin et al. | |
| 2013/0032485 | A1 | 2/2013 | Muramatsu et al. | |
| 2013/0140074 | A1 | 6/2013 | Yang et al. | |
| 2014/0106085 | A1 | 4/2014 | Cho et al. | |
| 2015/0176819 | A1 | 6/2015 | Kim et al. | |
| 2015/0245513 | A1 | 8/2015 | Moon | |
| 2015/0288055 | A1 | 10/2015 | Youm et al. | |
| 2015/0349406 | A1 | 12/2015 | Jung et al. | |
| 2020/0028243 | A1 | 1/2020 | Cho | |
| 2020/0264658 | A1 | 8/2020 | Seo et al. | |
| 2022/0037255 | A1 * | 2/2022 | Hwang | H10W 70/611 |
| 2023/0257884 | A1 | 8/2023 | Jung et al. | |

FOREIGN PATENT DOCUMENTS

| | | | |
|---|---|---|---|
| CN | 103179809 | | 6/2013 |
| CN | 103730716 | | 4/2014 |
| JP | 2004247549 | A | 9/2004 |
| JP | 2009159588 | A | 7/2009 |
| JP | 5354950 | B2 | 9/2013 |
| KR | 20010111286 | A | 12/2001 |
| KR | 100425728 | B1 | 4/2004 |
| KR | 100492465 | B1 | 5/2005 |
| KR | 100494034 | B1 | 6/2005 |
| KR | 100554855 | B1 | 6/2006 |
| KR | 100955546 | B1 | 4/2010 |
| KR | 20100092311 | A | 8/2010 |
| KR | 20150072028 | A | 6/2015 |
| KR | 101537739 | B1 | 7/2015 |
| KR | 20150099329 | A | 8/2015 |
| KR | 20150115586 | A | 10/2015 |
| KR | 20160011768 | A | 2/2016 |
| KR | 101736862 | B1 | 5/2017 |
| KR | 20170073321 | A | 6/2017 |
| KR | 101778553 | B1 | 9/2017 |
| KR | 20170138197 | A | 12/2017 |
| KR | 101868827 | B1 | 6/2018 |
| KR | 102053862 | B1 | 12/2019 |
| KR | 102055682 | B1 | 12/2019 |
| KR | 20200099733 | A | 8/2020 |
| KR | 20220052247 | A | 4/2022 |
| KR | 20220084540 | A | 6/2022 |
| WO | 2012/132325 | | 10/2012 |
| WO | 2022131440 | A1 | 6/2022 |
| WO | 2022131638 | A1 | 6/2022 |

OTHER PUBLICATIONS

Machine Translation of KR 10-2010-0092311 A. (Year: 2010).*

Extended Search Report dated Feb. 22, 2024 in European Patent Application No. 21883254.1.

International Search Report for PCT/KR2022/004051 mailed Jun. 30, 2022, 4 pages.

Written Opinion of the ISA for PCT/KR2022/004051 mailed Jun. 30, 2022, 3 pages.

Office Action dated Sep. 27, 2025 in Chinese Patent Application No. 202180071667.9 and English-language translation.

Notice of Allowance dated Sep. 25, 2025 in U.S. Appl. No. 18/137,062.

International Preliminary Report on Patentability dated Apr. 13, 2023 in International Application No. PCT/KR2021/014748.

Office Action dated Mar. 10, 2025 in Vietnamese Application No. 1-2023-02469 and English-language translation.

Office Action dated Mar. 21, 2025 in Korean Application No. 10-2021-0039524 and English-language translation.

Office Action dated Apr. 17, 2025 in Chinese Application No. 202180071667.9 and English-language translation.

Office Action dated Jan. 5, 2026 in Korean Application No. 10-2021-0024804 with English translation.

* cited by examiner

HOUSING COMPRISING PLATING LAYER AND ELECTRONIC DEVICE COMPRISING HOUSING

CROSS-REFERENCE TO RELATED APPLICATIONS

This application is a continuation of PCT/KR2022/004051, designating the United States, filed Mar. 23, 2022, in the Korean Intellectual Property Receiving Office, which claims priority to Korean Patent Application No. 10-2021-0039524, filed on Mar. 26, 2021, in the Korean Intellectual Property Office. The contents of each of these applications are incorporated by reference herein in their entireties.

BACKGROUND

Field

The disclosure relates to a housing including a plating layer and an electronic device including the housing.

Description of Related Art

By disposing a conductive member in a housing of an electronic device manufactured through various methods, the conductive member may be used as an antenna pattern or a wire for electrical connection of electronic components.

A flexible printed circuit board (FPCB) capable of being bonded to the housing or a method of plating the conductive member is used to dispose such a conductive member in a housing.

Of these methods, examples of a method of forming an antenna pattern by a plating method using a laser may include a laser direct structuring (LDS) method or a laser manufacturing antenna (LMA) method.

The LDS method is a plating method using a polymer resin. In this method, a metal organic compound is decomposed by a photochemical reaction through a laser, and an antenna pattern is formed by leaving metal only in the portion irradiated with the laser. In order to use the LDS method, it is necessary to add a heavy metal capable of acting as a catalyst for plating in a housing molding operation.

Unlike the LDS method, in the LMA method, plating is performed by irradiating to a housing with a laser without adding a heavy metal in the housing molding operation and then performing catalyst processing on the irradiated portion.

In addition to this, various attempts are being made to dispose a conductive member in a housing of an electronic device.

SUMMARY

In a case of using a FPCB, depending on the skill level of an assembler, there is a risk that defects may occur and there is a disadvantage that severe deviation may appear. In addition, in a case of the LDS method, there is a limitation in a housing material, but a housing for an LDS process has a problem of weak strength. Even if the LMA method is used, there may be a disadvantage in that the LMA is vulnerable to high temperature and high humidity and peeling easily occurs.

In addition, the above-described methods have a limitation in that it is necessary to perform the methods on an inner surface of the housing. When a conductive member is disposed on the outer surface of the housing, there may be a problem in that the conductive member is visually recognized from the outside due to a step difference between a portion where the conductive member is disposed and a portion where the conductive member is not disposed in the process of plating the conductive member.

Various example embodiments disclosed herein may provide an electronic device including an external housing plated with a conductive member capable of solving (or reducing) the problem of the conductive member being visually recognized from the outside while the conductive member is stably disposed on the outer surface of the housing constituting the exterior of the electronic device, and a method of manufacturing the electronic device.

An example electronic device according to various embodiments disclosed herein may include a body including a first portion having a first curvature, and a second portion having a second curvature, an outer plating layer including a conductive material and disposed on an outer surface of the body to be spaced apart by a predetermined interval from a boundary portion which is a boundary between the first portion and the second portion, and a coating layer disposed on the outer surface of the body to cover the plating layer.

An example electronic device according to various embodiments disclosed herein may include a housing including a body that includes a first portion having a first curvature, and a second portion having a second curvature, an outer plating layer including a conductive material and disposed on an outer surface of the body to be spaced apart by a predetermined interval from a boundary portion which is a boundary between the first portion and the second portion, and a coating layer disposed on the outer surface of the body to cover the coating layer.

According to various embodiments disclosed herein, it is possible to solve (or reduce) the problem of a plating layer being visually recognized from the outside even when the plating layer is disposed on the outer surface of the housing. Various other effects identified directly or indirectly through this disclosure may be provided.

BRIEF DESCRIPTION OF THE DRAWINGS

The above and/or other aspects of the disclosure will be more apparent by describing certain embodiments of the disclosure with reference to the accompanying drawings, in which:

FIGS. 2A-1, 2A-2, and 2B are views illustrating an example plating layer disposed on a housing according to various embodiments;

FIGS. 3A-1, 3A-2, 3B 4A, and 4B illustrate example electronic devices each of which includes an example housing that includes a plating layer according to various embodiments;

In connection with the description of the drawings, the same or similar components may be denoted by the same or similar reference numerals.

DETAILED DESCRIPTION

Figure 1:
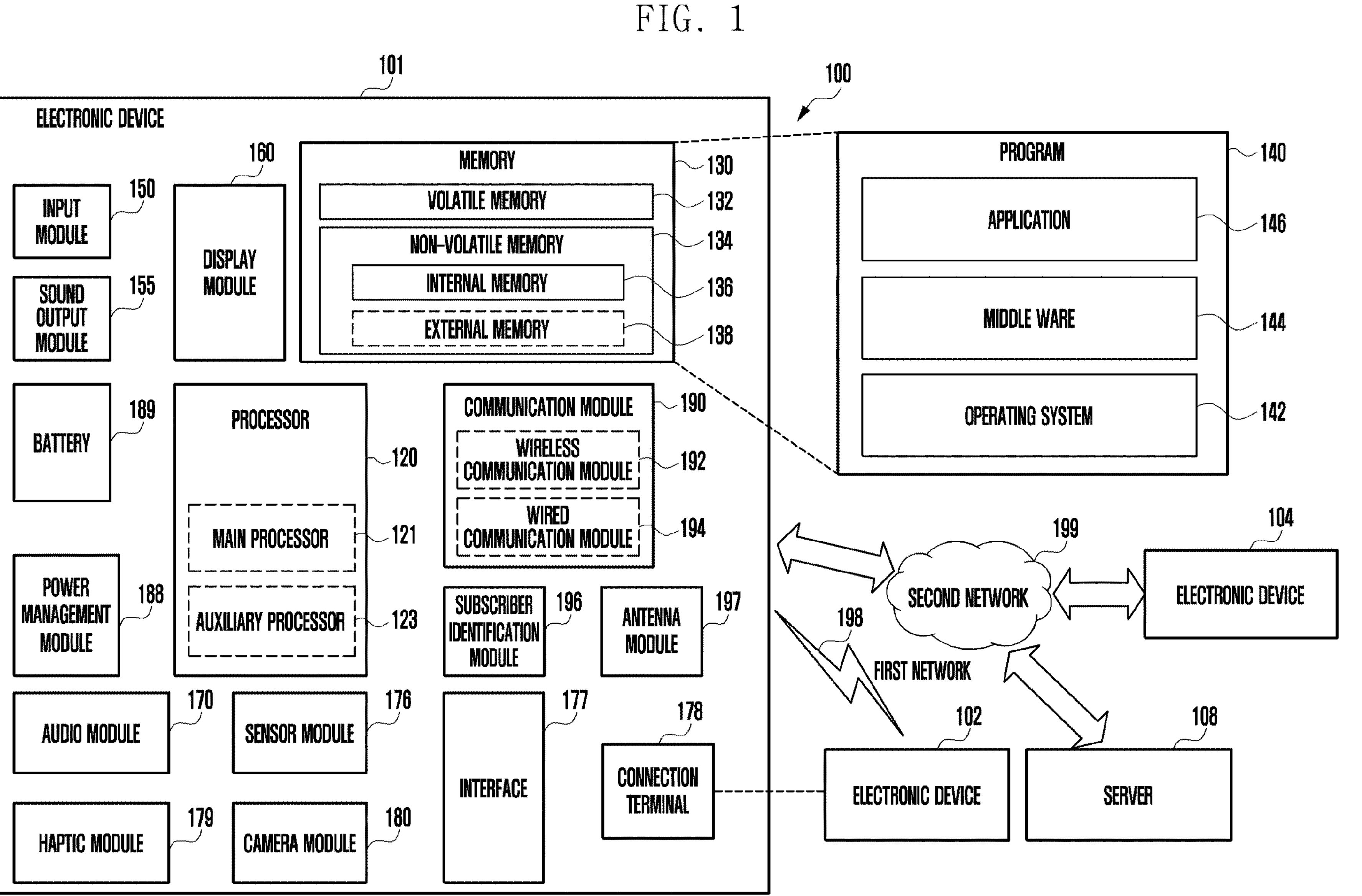
FIG. 1 is a block diagram of an example electronic device according to various embodiments in a network environment.

It should be appreciated that various embodiments of the present disclosure and the terms used therein are not intended to limit the technological features set forth herein to particular embodiments and are intended to include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and do not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of, the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of, the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of lms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of or including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figures 1, 2A:
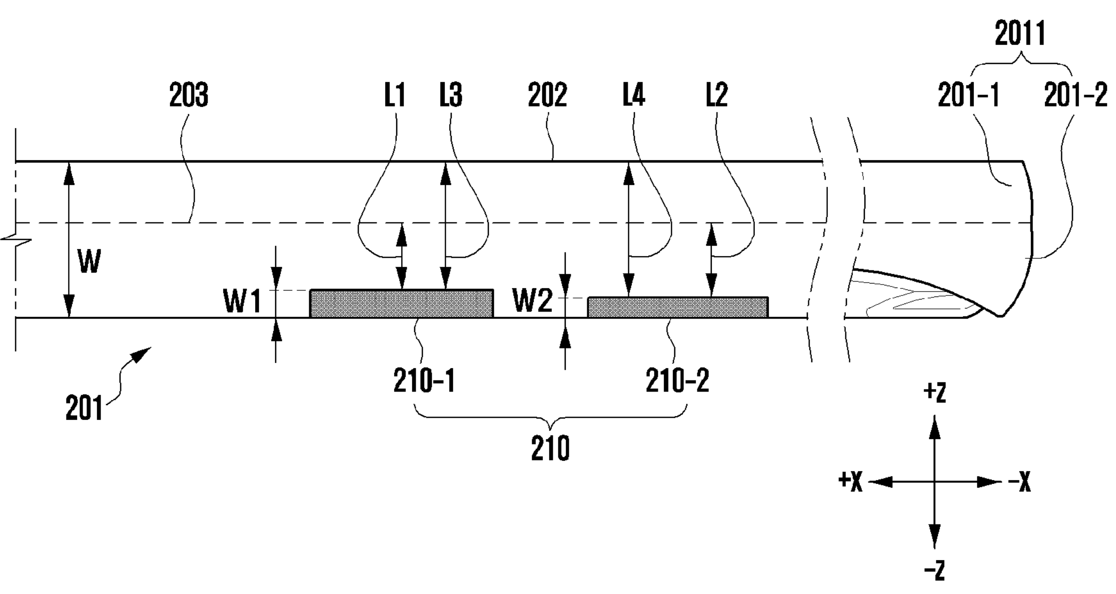
Figures 2, 2A:
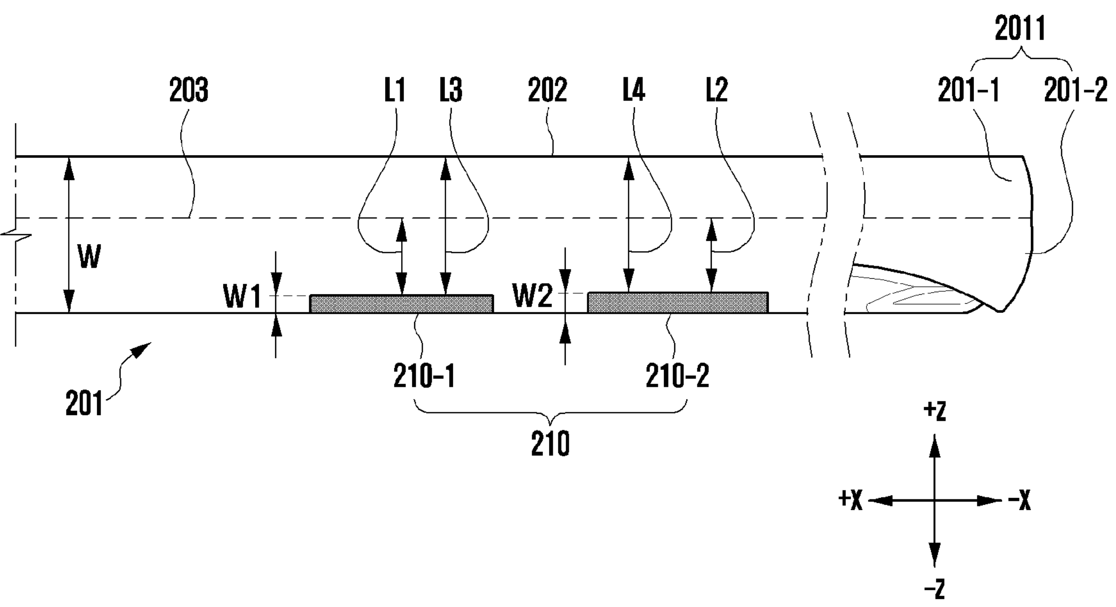
Figure 2B:
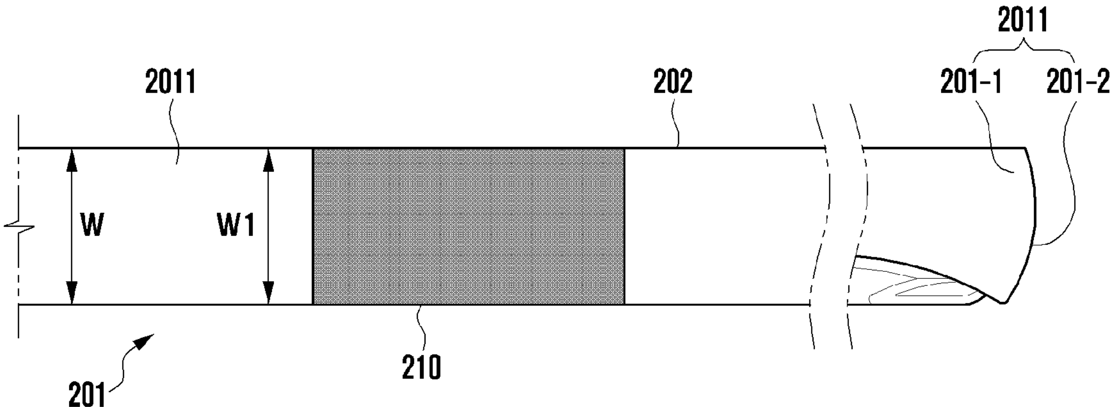
Figures 1, 3A:
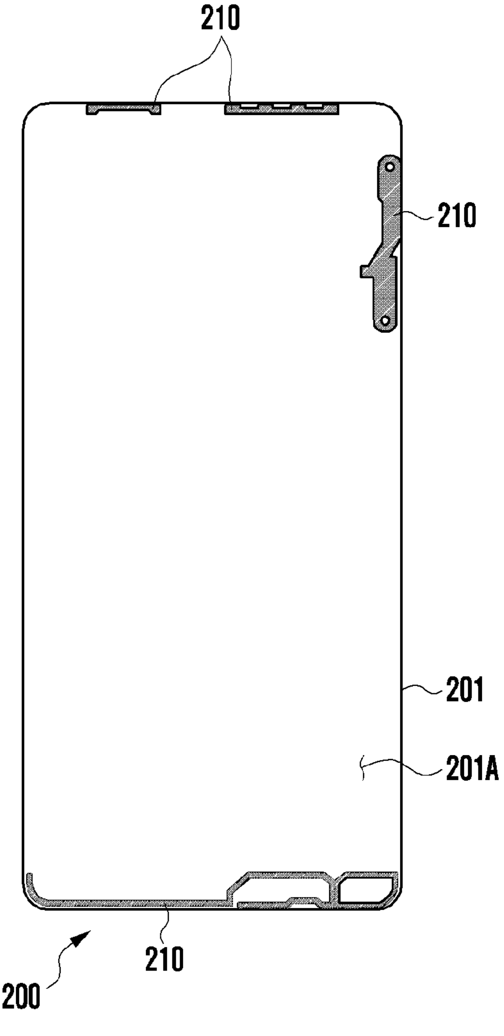
Figures 2, 3A:
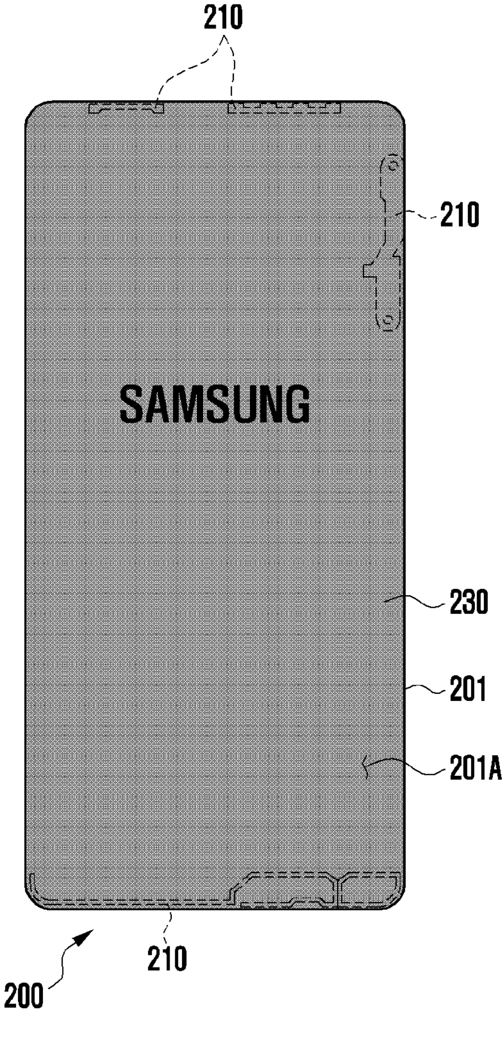

FIGS. 2A-1, 2A-2, and 2B are views illustrating a plating layer disposed on a housing according to various embodiments disclosed herein. FIGS. 3A-1, 3A-2, 3B, 4A, and 4B illustrate electronic devices each of which includes a housing that includes a plating layer according to various embodiments disclosed herein. FIG. 3A-1 and FIG. 4A are views each illustrating a state in which a plating layer is visually recognized before forming a coating layer.

According to various embodiments, an electronic device may include a housing 201 constituting an exterior thereof. The housing 201 may be made of various materials. The housing 201 may be made of, for example, a material such as metal or synthetic resin. In addition, the housing 201 may be manufactured through various methods. For example, the housing 201 may be manufactured through an injection molding method. A body 2011 constituting the exterior shape of the housing 201 may have various shapes. For example, the body 2011 may have a curved surface having at least one curvature. Referring to FIGS. 2A-1 and 2A-2, a side surface of the body 2011 may have a convex shape. Design elements of the electronic device may be considered in the shape of the side surface of the body part 2011. It may be to improve the feeling of grip when holding the electronic device.

In an embodiment, the body 2011 may have two curvatures. For example, as illustrated in FIGS. 2A-1 and 2A-2, the body 2011 may include a first portion 201-1 having a first curvature and a second portion 201-2 having a second curvature. In various embodiments, the first curvature of the first portion 201-1 may be, for example, R6.78, and the second curvature of the second portion 201-2 may be, for example, R4.81. The shape of the body 2011 illustrated in FIG. 2A is only an example, and the housing may be manufactured in various shapes. For example, the body 2011 may have a single curvature.

In an embodiment, an outer plating layer 210 may be disposed on the outer surface of the body 2011. In an embodiment, the outer plating layer 210 may be connected to an inner plating layer (e.g., the inner plating layer 1022 in FIG. 10) disposed on the inner surface of the body 2011. In the following description made with reference to FIGS. 2A-1 and 2A-2, the outer plating layer 210 will be referred to as a "plating layer 210". Referring to FIGS. 2A-1 and 2A-2, the plating layer 210 may be disposed on the side surface of the body 2011. The plating layer 210 may be disposed on at least one of the first portion 201-1 and the second portion 201-2. The plating layer 210 may include a conductive member. The plating layer 210 may be used for various purposes. For example, the plating layer 210 may execute a function of transmitting an electrical signal (e.g., a wire function or various sensor functions). The plating layer 210 may execute a function of radiating a communication signal (e.g., an RF signal) to the outside (e.g., an antenna function). In addition, the plating layer 210 may execute a heat dissipation function of dissipating heat generated inside the electronic device to the outside. In addition, the plating layer 210 disposed on the outer surface of the body 2011 may execute various functions.

In an embodiment, a coating layer (e.g., the coating layer 670 in FIG. 6E) may be disposed on the plating layer 210. Design elements of the electronic device may be added by applying color and texture to the housing constituting the exterior of the electronic device through the coating layer. When the coating layer is disposed on the plating layer 210, the coating layer 210 is covered by the coating layer, so that the coating layer 210 may not be visually recognized from the outside. For example, a difference in visibility may exist between a portion where the plating layer 210 is disposed and a portion where the plating layer 210 is not disposed. In various embodiments disclosed herein, various methods for improving the visibility of the coating layer disposed on the plating layer 210 may be presented.

Referring to FIGS. 2A-1 and 2A-2, the plating layer may be disposed at a position spaced apart by a predetermined distance from the boundary between the first portion 201-1 and the second portion 201-2 (hereinafter, referred to as a "boundary portion 203"). For convenience of description, the boundary portion 203 is indicated by an imaginary line in FIGS. 2A-1 and 2A-2. It has been found that it is possible to improve the visibility of the coating layer when the plating layer 210 is disposed to be spaced apart from the boundary between portions having different curvatures. As a result of controlling other variables and observing a difference in visibility of the coating layer depending on the distance between the boundary portion 203 and the plating layer 210, it was found that the visibility deteriorated when the plating layer 210 was located adjacent to the boundary portion 203. In the process of forming a coating layer, the coating may flow down due to gravity, so that a thin coating layer may be formed in the boundary portion 203, and a thick coating layer may be formed in a portion far from the boundary portion 203. Since the coating layer is formed thin in a portion close to the boundary portion 203, bubbles may be generated by gas. For this reason, the coating quality in a portion close to the boundary portion 203 may be relatively lower than that in a portion far from the boundary portion. It is possible to improve the visibility of the coating layer by disposing the plating layer 210 in a portion in which the coating quality is relatively good.

Meanwhile, since the distance between the boundary portion 203 and the plating layer 210 is not affected even if the length of the plating layer 210 (e.g., the length in the X-axis direction in FIGS. 2A-1 and 2A-2) increases or decreases, the change in the length of the plating layer 210 may not lead to a decrease in the visibility of the plating layer. For example, when the plating layer 210 is used as an antenna, the length of the plating layer 210 may be a major factor in determining the resonant frequency of the antenna. Since the visibility is not deteriorated even if the length of the plating layer 210 is changed, the plating layer 210 may be freely designed to have a resonant frequency of a specific band.

In an embodiment, the plating layer 210 may include a first sub-plating layer 210-1 and a second sub-plating layer 210-2. The first sub-plating layer 210-1 and the second sub-plating layer 210-2 may be disposed on the outer surface of the body 2011 at positions spaced apart from each other. The boundary portion 203 and the first sub-plating layer 210-1 may be spaced apart from each other by a first distance L1, and the boundary portion 203 and the second sub-plating layer 210-2 may be spaced apart from each other by a second distance L2. For example, when the width (e.g., the length in the Z-axis direction in FIGS. 2A-1 and 2A-2) W of the body 2011 is about 5.28 mm, the width of the first sub-plating layer 210-1 (e.g., the length in the Z-axis direction in FIGS. 2A-1 and 2A-2) W1 may be about 1.0 mm (see FIG. 2A-1). The width W2 of the second sub-plating layer 210-2 may be about 0.67 mm. The distance L3 from a first end 202 of the body 2011 (e.g., the end in the +Z direction in FIG. 2A) to the first sub-plating layer 210-1 may be about 4.28 mm. The distance L4 from the first end 202 of the body 2011 to the second sub-plating layer 210-2 may be about 4.61 mm. In an embodiment, the width W1 of the first sub-plating layer 210-1 may be about 0.6 mm (see FIG. 2A-2). The width W2 of the second sub-plating layer 210-2 may be about 0.67 mm. The distance L3 from the first end 202 of the body 2011 to the first sub-plating layer 210-1 may be about 4.68 mm. The distance L4 from the first end 202 of the body 2011 to the second sub-plating layer 210-2 may be about 4.61 mm. In addition, the widths and placement positions of the first sub-plating layer 210-1 and the second sub-plating layer 210-2 may be variously changed.

According to various embodiments, when the curvature of the body 2011 is greater than a critical curvature, the placement position of the plating layer 210 may be freely designed. When the curvature of the body 2011 is greater than the critical curvature, a slight gas defect may occur in the coating layer. For example, the threshold curvature may be configured to be R10. In this case, when the curvature of the body 2011 is greater than R10, it may be possible to place the plating layer 210 in the center of the side surface of the body 2011, and the width of the plating layer 210 may be configured to be substantially the same as the width of the body 2011. For example, as illustrated in FIG. 2B, the plating layer 210 may be provided such that the width W1 of the plating layer 210 is substantially equal to the width W of the body 2011. In an embodiment, the plating layer 210 may be used as a heat dissipation member. The plating layer 210 may dissipate heat from internal electronic components to the outside. When the width of the plating layer 210 is configured to be large, heat dissipation efficiency may be improved.

Figure 6A:
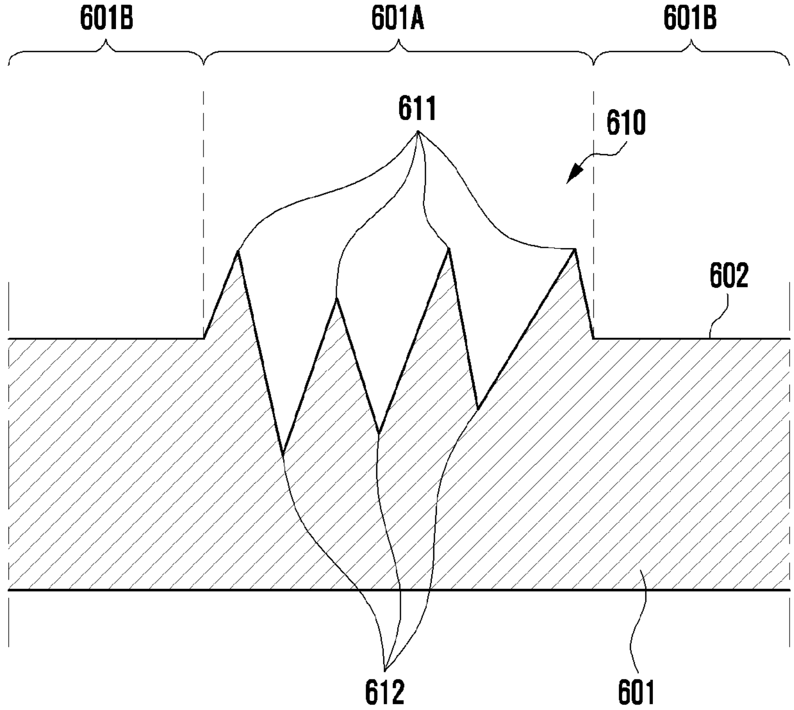
FIG. 6A is a view illustrating a state in which an example trench is formed according to various embodiments.
Figure 6B:
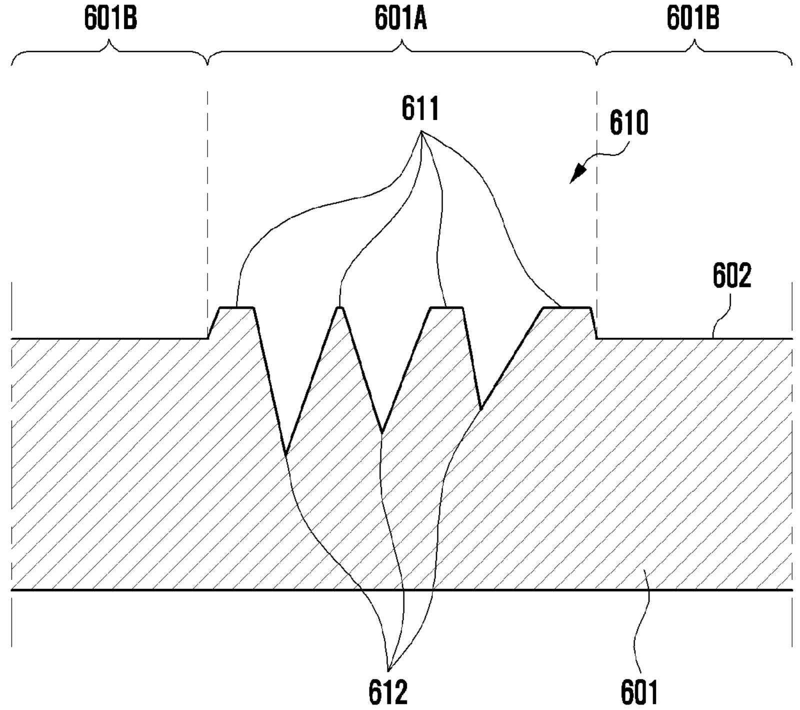
FIG. 6B is a view illustrating a state in which an example first polishing operation is performed in the trench illustrated in FIG. 6A.

In an embodiment, the plating layer 210 may be disposed in a trench (e.g., the trench 610 in FIG. 6B). In the following description, reference will be made to FIG. 6E.

The trench may be fine irregularities provided on the surface of the body 601 to enable plating on the body 601. For example, a trench may be formed in the body 601 through a trenching operation 501 to be described with reference to FIG. 5. The trench may be irregularities in which valleys 612 concave with respect to the surface of the body 601 and peaks 611 convex with respect to the surface of the body 601 are repeated. Referring to FIG. 6E, the valleys 611 in the trench may include processed portions 611-1 in which the peaks are partially removed. The processed portions 611-1 may be portions obtained by partially removing the peaks 611 through a polishing process (e.g., the first polishing operation 502 in FIG. 5). The plating layer 620 disclosed herein may be disposed on the polished trench (e.g., the trench 610 in FIG. 6B). By partially removing the peaks 611, a step difference, which has occurred due to the trench may be partially compensated for. When the coating layer 670 is disposed in a state in which the step difference is compensated, it is possible to improve the visibility of the coating layer 670 by reducing a difference between a portion where the plating layer 620 is disposed and a portion where the plating layer is not disposed. In addition, since there is no need to use an expensive step difference compensating member (e.g., putty) in order to remove step difference during the coating process, it is possible to reduce a unit process cost. In an embodiment, the surfaces of the processed portions 611-1 may be formed substantially parallel to the surface of the body portion 601.

According to various embodiments, as illustrated in FIG. 6E, the coating layer 670 may be disposed on the body 601 to cover the plating layer 620. The manufacturing of the housing will be described in more detail with reference to FIG. 5.

Referring to FIGS. 3A-1 and 3A-2, a plating layer 210 may be disposed in a plating area corresponding to at least a partial area of the outer surface 201A of the housing 201. The outer surface 201A may be a surface exposed to the outside from the housing 201. The plating layer 210 may be disposed on the outer surface 201A of the housing 201 through a plating method. For example, the plating layer 210 may include a first plating layer (e.g., the first plating layer 620 in FIG. 6D) formed by a first plating operation (e.g., the first plating operation 503 in FIG. 5) to be described later and/or a second plating layer (e.g., the second plating layer 630 in FIG. 6E) formed by the second plating operation (e.g., the second plating operation 505 in FIG. 5).

Referring to FIG. 3A-2, a coating layer 230 may be formed on the outer surface 201A of the housing 201. Since the coating layer 230 is formed on the outer surface 201A of the housing 201 including the plating area where the plating layer 210 is disposed, the plating layer 210 may not be exposed to the outside of the electronic device 200. Since the plating layer 210 is not visually recognized from the outside, it is possible to prevent the aesthetics of the electronic device 200 from being damaged due to visual recognition of the coating layer 210 from the outside.

According to various embodiments, the plating layer 210 may be used as a component for the electronic device 200 which requires transmission of electrical signals. For example, the plating layer 210 may be used as an antenna for short-range and/or long-range communication of the electronic device 200. In addition, the plating layer 210 may be used as a wire that electrically interconnects various electronic components. In addition, the plating layer 210 may be variously used for a touch sensor configured to a capacitive touch input, or the like. The aforementioned uses of the plating layer 210 are only examples, and the plating layer 210 may be used for various components that require transmission of electrical signals.

According to various embodiments, the coating layer 230 formed on the outer surface 201A of the housing 201 may be formed of various materials having different properties depending on components of the electronic device for which the plating layer 210 is to be used. For example, when the plating layer 210 is used as an antenna or a wire that electrically interconnects electronic components, the coating layer 230 may be formed of an insulating material having low conductivity. In contrast, when the plating layer 210 is used for a component that needs to recognize an electrical signal from the outside, the coating layer 230 may be formed of a conductive material. For example, when the plating layer 210 is used for a touch sensor that recognizes a capacitive touch input, the coating layer 230 may be formed of a conductive material.

According to various embodiments, the plating area where the plating layer 210 is disposed may be thicker than other areas of the housing 201. When the plating area is formed thickly, the area may have relatively stronger resistance to an external impact. This may make it possible to prevent or reduce a phenomenon in which the plating layer 210 is damaged by an external impact. By forming the plating area thickly, the plating layer 210 disposed in the plating area may maintain a predetermined performance.

Figure 3B:
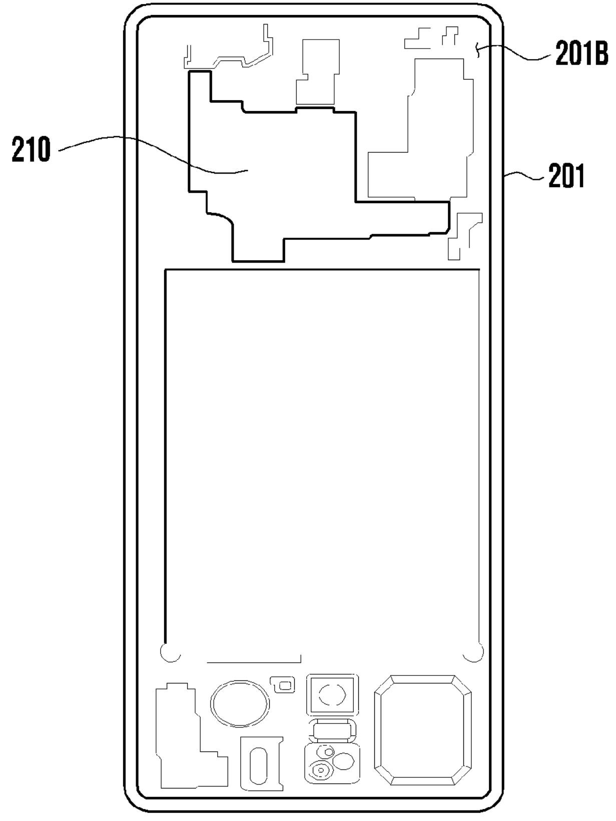
Figure 4A:
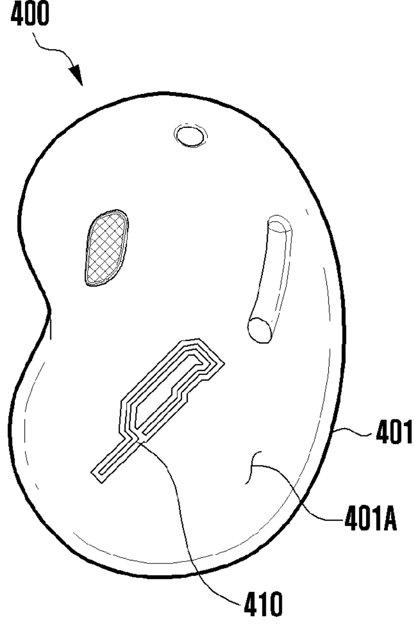

According to an embodiment, as illustrated in FIG. 3B, a plating layer 210 may be disposed on the inner surface 201B of the housing 201. The inner surface 201B is a surface opposite to the outer surface 201A, and may be a surface facing at least some of the electronic components disposed inside the electronic device 200. In this case, the plating area where the plating layer 210 is disposed may refer, for example, to at least a partial area of the inner surface 201B of the housing 201. The inner surface 201B of the housing 201 may be a surface facing the electronic components disposed inside the electronic device 200. The plating layer 210 disposed on the inner surface 201B may be used as a wire electrically connected to an electronic component, or may be used as a heat dissipation member for heat transfer by being disposed in an area that faces heating components that generate significant heat (e.g., a processor (e.g., the processor 120 in FIG. 1), a power management module (e.g., the power management module 188 in FIG. 1), and/or a battery (e.g., the battery 189 in FIG. 1)). When the plating layer 210 is used as the heat dissipation member, a plating area where the plating layer 210 is disposed may be an area at least partially facing the heating components. The aforementioned uses of the plating layer 210 are only examples, and the plating layer 210 may be used for various components that require transmission of electrical signals or transfer of heat.

Figure 4B:
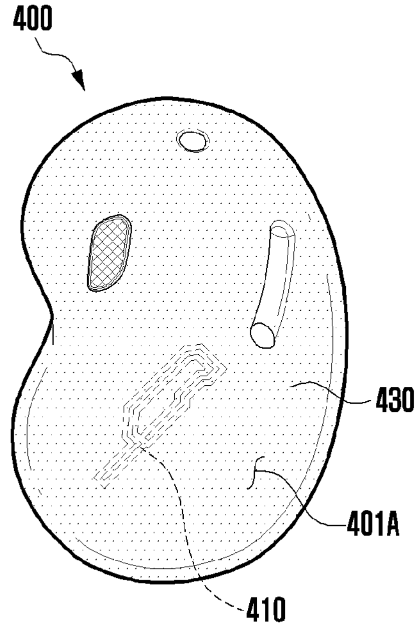

According to various embodiments, the electronic device illustrated in FIGS. 4A and 4B may be an electronic device 400 that is worn on a user's ear and is connected to an external electronic device through short-range communication to reproduce sound. A plating layer 410 may be disposed on a partial area of the outer surface 401A of the housing 401 constituting the exterior of the electronic device 400. The outer surface 401A may refer, for example, to a surface on which the housing 401 is exposed to the outside. The plating layer 410 may be used as an antenna for connecting an external electronic device to the electronic device 400. In addition, the plating layer 410 may be used for a touch sensor for receiving a user's touch input. As illustrated in FIG. 4B, a coating layer 430 may be formed on the outer surface 401A of the housing 401. Since the plating layer 410 is covered by the coating layer 430, the plating layer 410 may not be visually recognized from the outside.

Figure 5:
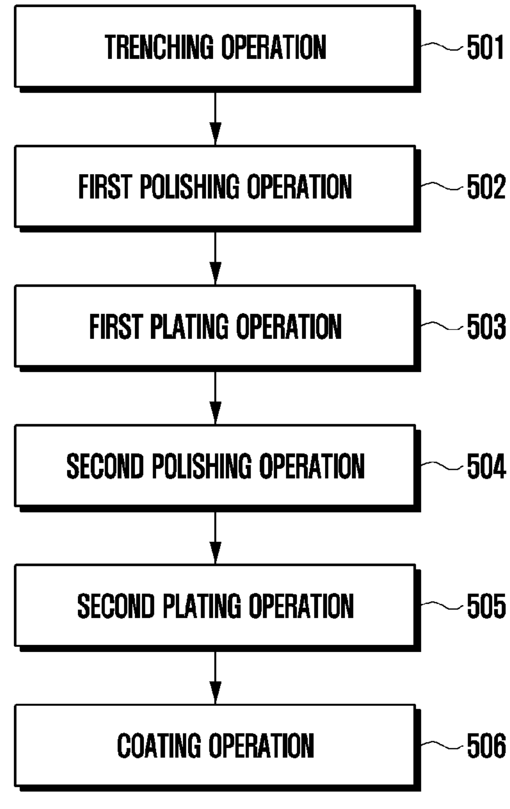
FIG. 5 is a flowchart of an example manufacturing method according to various embodiments.
Figure 6C:
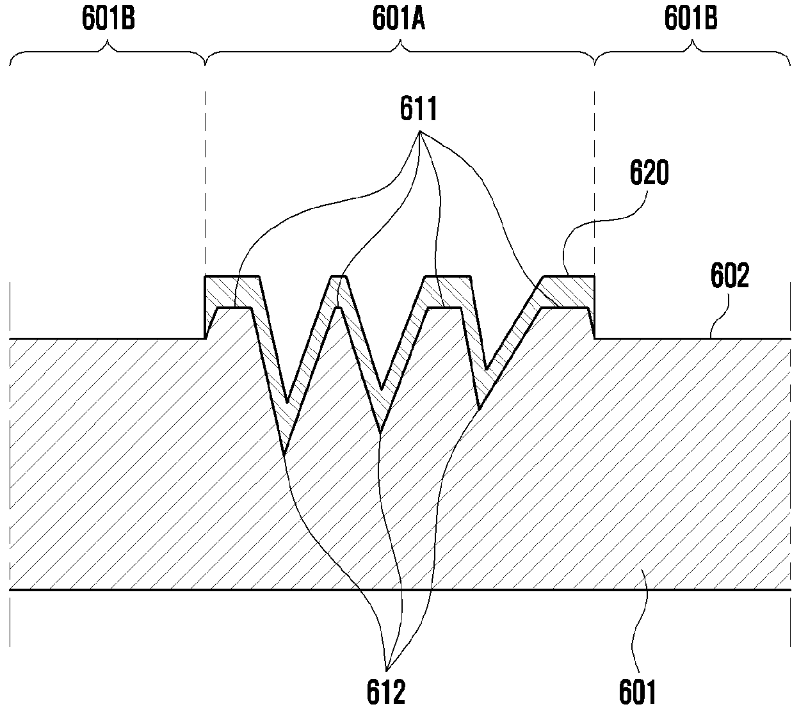
FIG. 6C is a view illustrating a state in which an example first plating operation is performed in the polished trench illustrated in FIG. 6B.
Figure 6D:
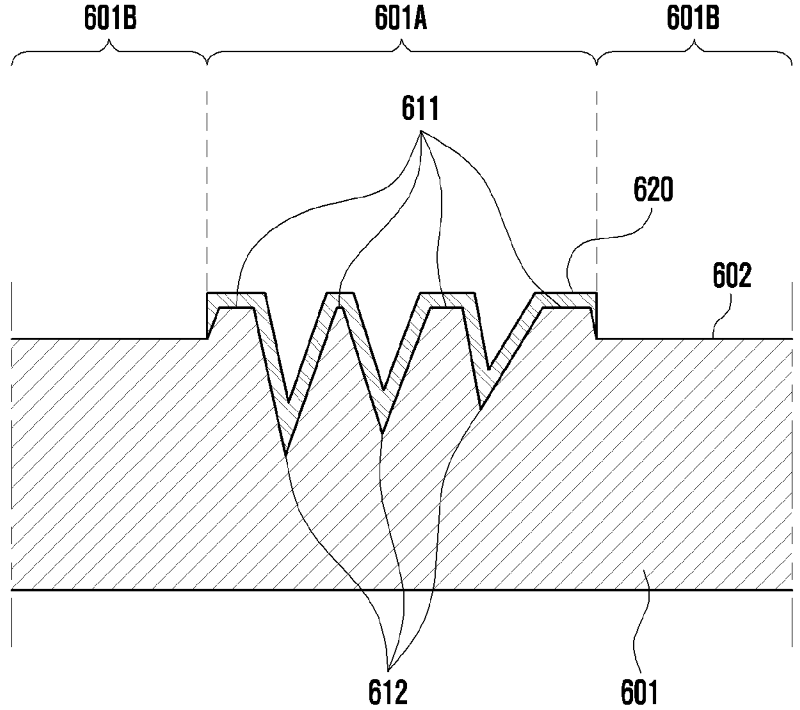
FIG. 6D is a view illustrating a state in which an example second polishing operation is performed on the first plating layer illustrated in FIG. 6C.
Figure 6E:
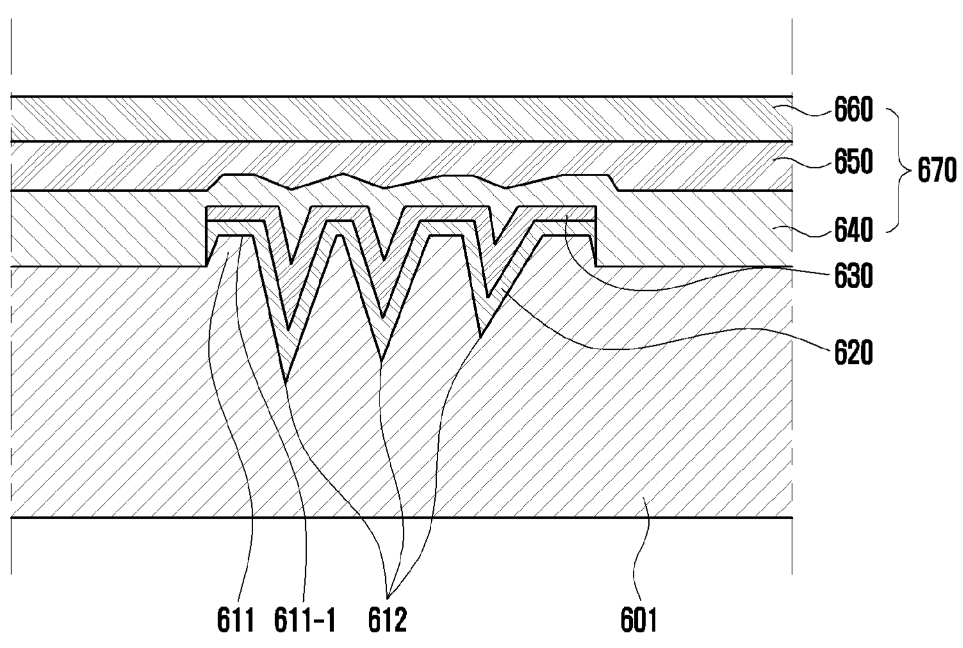
FIG. 6E is a view illustrating a state in which an example second plating operation and an example coating operation are performed according to various embodiments.
Figure 7:
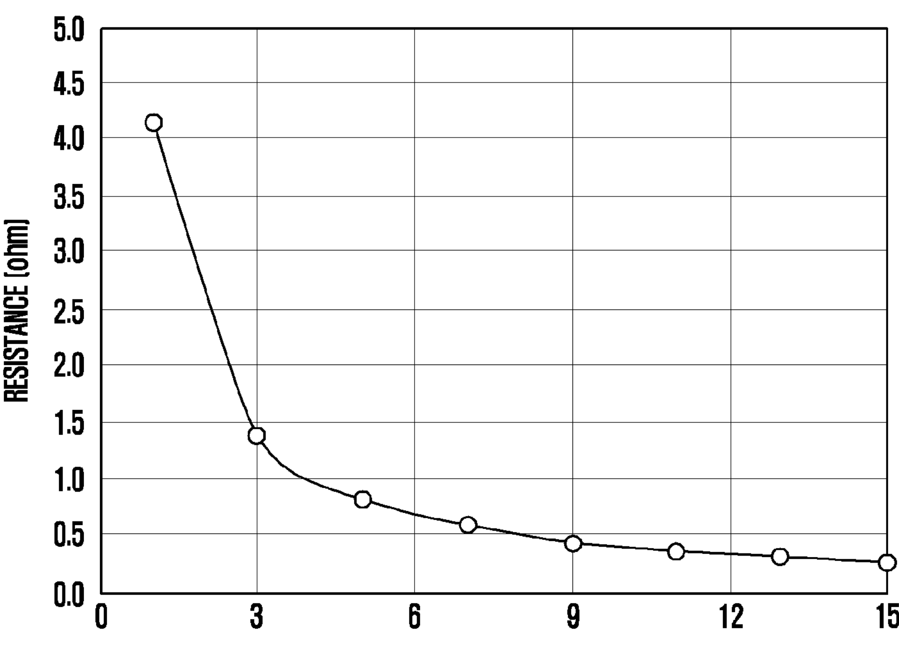
FIG. 7 is a graph showing the relationship between a thickness and a performance of an example plating layer.

FIG. 5 is a flowchart of an example manufacturing method according to various embodiments disclosed herein. FIG. 6A is a view illustrating a state in which a trench is formed according to various embodiments disclosed herein. FIG. 6B is a view illustrating a state in which a first polishing operation is performed in the trench illustrated in FIG. 6A. FIG. 6C is a view illustrating a state in which a first plating operation is performed in the polished trench illustrated in FIG. 6B. FIG. 6D is a view illustrating a state in which a second polishing operation is performed on the first plating layer illustrated in FIG. 6C. FIG. 6E is a view illustrating a state in which a second plating operation and a coating operation are performed according to various embodiments disclosed herein. FIG. 7 is a graph showing the relationship between a thickness and a performance of a plating layer.

According to various embodiments, a plating layer (e.g., the plating layer 210 in FIG. 2) and a coating layer 670 (e.g., the coating layer 230 in FIG. 2) may be formed through a manufacturing method including a trenching step 501, a polishing operation (a first polishing operation 502 and a second polishing operation 504), a plating operation (a first plating operation 503 and a second plating operation 505), and a coating step 506. The plating layer may include a first plating layer 620 and/or a second plating layer 630.

According to various embodiments, the trenching operation 501 may be an operation of forming a trench 610 in the plating area 601A of the housing 601. As illustrated in FIG. 6A, the trench 610 may refer, for example, to fine irregularities in which peaks 611 and valleys 612 are continuous. The peaks 611 may refer, for example, to portions formed convexly with respect to the reference surface 602, and the valleys 612 may refer, for example, to portions formed concavely with respect to the reference surface 602. The trenching operation 501 may be performed through a variety of processing techniques. For example, the trench 610 may be formed by radiating a laser to the plating area 601A, and a technique that chemically etches portions of the plating area 601A with a solvent, such as etching or decapsulating, may be used. In addition, it is also possible to form the trench 610 by using a computerized numerical control (CNC) milling method that physically and precisely processes a plating area 601A through computer calculation. In addition, the trench 610 may be formed through various methods. Regarding the formation of the trench 610 using a laser, the trench 610 may be formed by radiating a single laser beam, the trench 610 be formed by radiating at least two laser beams which overlap each other, and the trench 610 may be formed by radiating at least two laser beams which are spaced apart from each other by a predetermined interval. In addition, the trench 610 may be formed by radiating a laser in various ways. According to various embodiments, the trench 610 may be formed such that the depth of the valleys 612 is about 10 μm to about 15 μm and the height of the peaks 611 are about 8 μm to about 10 μm.

According to various embodiments, a first polishing operation 502 may be performed after the trenching operation 501. The first polishing operation 502 may be an operation of partially cutting the trench 610 formed in the plating area 601A through the trenching operation 501. Referring to FIG. 6B, the peaks 611 in the trench 610 may be partially cut through the first polishing operation 502.

According to various embodiments, a first plating operation 503 may be performed after the first polishing operation 502. The first plating operation 503 may include degreasing, etching, neutralization, catalyst application, and activation operations. The degreasing operation may be a cleaning operation of removing foreign matter such as grease that may be included in the plating area 601A. The etching operation may be an operation of removing an oxide film formed on the surface of the plating area 601A. The neutralization and catalyst application operations may be operations of preparing of forming, by a plating method, a first plating layer 620 including a first metal material in the plating area 601A that has undergone the degreasing and etching operations. The neutralization and catalyst application operations may be operations that allow a reduction reaction to occur in the plating area 601A so that the first metal material can be deposited on the plating area 601A. The activation operation may be an operation of forming the first plating layer 620 in the plating area 601A. See FIG. 6C. According to various embodiments, the first metal material may include at least one of metal materials including nickel (Ni), copper (Cu), or silver (Ag). For example, in the activation operation, the plating area 601A may be plated in the order of nickel, copper, and silver. In this case, the first plating layer 620 may be formed in the order of a nickel layer, a copper layer, and a silver layer. By using silver as the first metal material, it is possible to reduce the cost of the plating process. According to various embodiments, when forming the trench 610, the depth of the valleys 612 may be reduced to reduce the amount of the first metal material required for the first plating operation 503 and the time required for the plating process.

According to various embodiments, a second polishing operation 504 may be performed after the first plating operation 503. The second polishing operation 504 may be an operation of cutting a portion of the first plating layer 620. See FIG. 6D. The first plating layer 620 cut in the second polishing operation 504 may be the first plating layer 620 formed on the peaks 611 formed in the trench 610 and partially cut through the first polishing operation 502. When the first plating layer 620 is partially cut through the second polishing operation 504, the step difference may be reduced. When the portion of the housing 601 other than the plating area 601A is referred to as a reference area 601B, a step difference between the plating area 601A and the reference area 601B may be reduced through the second polishing operation 504.

According to various embodiments, the second plating operation 505 may be a plating operation of forming a second plating layer 630 including a second metal material. See FIG. 6E. Since details of the second plating operation 505 are the same as those of the first plating operation 503, a detailed description thereof will not be repeated. In an embodiment, the second metal material may include a metal material containing nickel (Ni). In an embodiment, the second metal material may be a metal material different from the first metal material. By adding the second plating operation 505, the performance of the plating layer may be improved by forming the plating layer thicker.

Referring to FIG. 7, the thickness of a plating layer may be related to the performance of the plating layer. The plating layer may include the first plating layer 620 formed by the first plating operation 503 and/or the second plating layer 630 formed by the second plating operation 505. As illustrated in FIG. 7, as the thickness of the plating layer (e.g., the conductive member) increases, the resistance of the plating layer decreases, and thus the electrical conductivity of the plating layer may be improved. In addition, as the surface of the plating layer is more uniform, the performance of the plating layer may be improved. In particular, in a case in which the plating layer is used as an antenna pattern, as the surface of the plating layer is more uniform, the reflection coefficient may decrease, allowing the efficiency of the antenna to be improved. In the manufacturing method according to various embodiments disclosed herein, the first polishing operation 502 and the second polishing operation 504 are performed after forming the trench 610 to make the surface more even. Thus, even if the same material is used, it is possible to form a plating layer having a thicker and more uniform surface. In addition, it is possible to reduce the thicknesses of the first plating layer 620 and the second plating layer 630 by reducing the step difference occurring due to trench formation through the polishing operation (e.g., the first polishing operation 502 and the second polishing operation 504). For example, the thickness of the plating layer including the first plating layer 620 and the second plating layer 630 may be about 11 μm to about 15 μm. In an embodiment, the thickness of a layer including copper (Cu) and silver (Ag) in the plating layer may be about 8 μm. As described above, by reducing the thickness of the plating layer, it is possible to reduce the step difference between the plating area 601A where the plating layer is disposed and the reference area 601B. For this reason, it is possible to simplify a process for compensating for a step difference in the coating operation 506 for blocking the plating layer from being visually recognized from the outside.

According to various embodiments, since a coating layer 670 (FIG. 6E) is formed on a first surface of the housing 601 including the plating area 601A on which the plating layer (e.g., the first plating layer 620 and the second plating layer 630) are disposed through the coating operation 506, the coating layer may be covered by the coating layer 670 not to be visible from the outside of the electronic device. The coating operation 506 may include a plurality of operations. In an embodiment, the coating operation 506 may include a step difference compensation operation, a coloring operation, and a protection operation. In the coating operation 506 described above, each operation is only an example, and some operations may be added or some operations may be omitted. According to various embodiments, the coating layer 670 may include a compensation layer 640, a color layer 650, and a protective layer 660.

According to various embodiments, the step difference compensation operation may be an operation for forming a compensation layer 640 for removing a step difference between the plating area 601A where the conductive material is disposed and the reference area 601B which is an area other than the plating area 601A. For example, the compensation layer 640 may be formed of a material such as a primer or a surfacer. The compensation layer 640 may enhance adhesion between the color layer 650 and the compensation layer 640 so that the color layer 650 to be laminated on the compensation layer 640 does not peel off from the compensation layer 640. In addition, the material included in the compensation layer 640 may include an antirust material. According to various embodiments disclosed herein, since the step difference between the plating area 601A and the reference area 601B has been compensated for to a certain degree in advance through the polishing operations (first polishing operation 502 and second polishing operation 504), there is no need to use an expensive material such as putty for compensating for the step difference. Thus, it may be possible to significantly lower process costs. In an embodiment, the compensation layer 640 may be formed of two or more different primers. For example, two primers may be used. Since the step difference has been partially removed through the polishing operation 503, it is possible to reduce the amount and number of primers for compensating for the step difference as needed.

According to various embodiments, the coloring operation may be an operation of forming a color layer 650. The color layer 650 may be formed of a paint having a color. In this case, by configuring the thickness of the color layer 650 in units of A, the color layer 650 may have a metallic feel.

According to various embodiments, an operation of forming a UV coating layer (not illustrated) including a UV coating material may be further included between the step difference compensation operation and the coloring operation.

According to various embodiments, the protection operation may be an operation of forming the protective layer 660 on the color layer 650. The coating operation 506 may be an operation of forming a coating film on the color layer 650 to protect the color layer 650.

The above-described coating operation 506 may be variously changed within a range that may be understood by a person ordinarily skilled in the art. For example, some of the operations performed in the above-described coating operation 506 may be omitted, and materials used in respective operations may be variously changed as needed.

Through such a coating operation 506, the plating layer may not be visually recognized from the outside of the electronic device. Since the step difference between the plating layer or the plating area 601A where the plating layer is disposed and the reference area 601B has been compensated for through the polishing operation 503, the surface step difference of the coating layer 670 may also be reduced. By reducing the step difference between the plating area 601A and the reference area 601B, it is possible to solve (or reduce) a problem in which the plating layer is visually recognized from the outside due to the step difference between a portion where the plating layer is disposed and a portion where the plating layer is not disposed.

The flowchart of the manufacturing method illustrated in FIG. 5 is only an example, and the manufacturing method may be variously changed within a range that may be understood by a person ordinarily skilled in the art. Some of individual operations of the manufacturing method illustrated in FIG. 5 may be omitted or the order of some operations may be changed. In the foregoing, the term "$n^{th}$ operation" is not intended to limit the order of the operation. What is called a "step" may be understood as a "process" or an "operation".

For example, plating operations other than the first plating operation 502 and the second plating operation 504 may be added, or the second plating operation 504 may be omitted.

In addition, although the polishing operation is described as being performed twice including the first polishing operation and the second polishing operation in FIG. 5, the number of polishing operations is not limited thereto. For example, the polishing operation may be performed once. In this case, the polishing operation may be performed once after the trenching operation, may be performed once after the first plating operation, or may be performed once after the first plating operation and the second plating operation. In addition, the order in which the polishing operation is performed may be variously changed. For example, the polishing operation may be performed after the trenching operation and before the first plating operation or the second plating operation is performed, may be performed after the first plating operation, or may be performed after the first plating operation and the second plating operation.

In addition, the coating operation 506 may be omitted.

Figure 8:
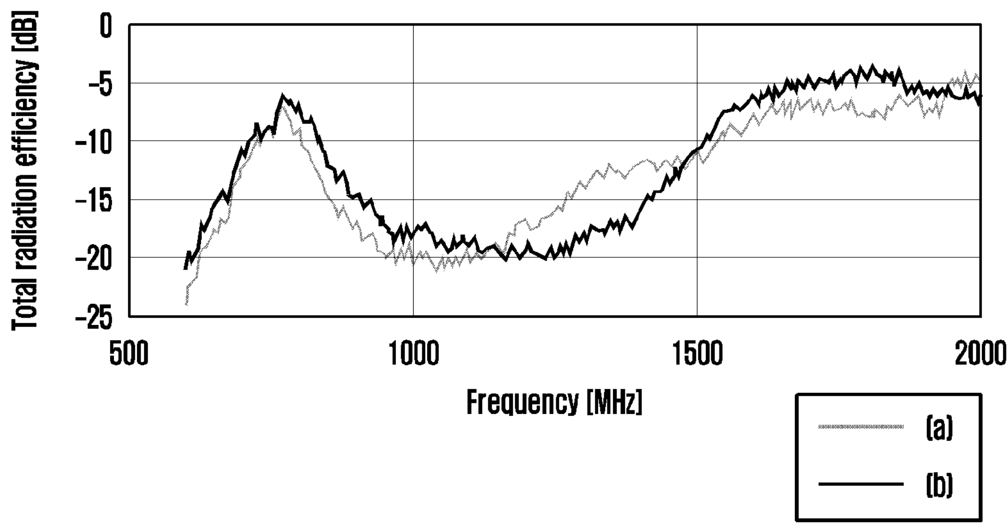
FIG. 8 is a graph showing, in comparison, performances of an antenna disposed in an FPCB with an antenna in a case in which a plating layer formed according to various embodiments was used as the antenna.

FIG. 8 is a graph showing, in comparison, performances of an antenna disposed in an FPCB with an antenna in the case where a plating layer formed according to various embodiments disclosed herein was used as the antenna.

Graph (a) of FIG. 8 is a performance graph of an antenna disposed on a flexible printed circuit board (FPCB), and graph (b) of FIG. 8 is a performance graph of an antenna in a case in which a plating layer formed through the manufacturing method disclosed herein was used as the antenna. Referring to FIG. 8, it is noted that the radiation efficiency of graph (b) appears higher in a band of about 700 MHz to about 800 MHz. This frequency band corresponds to long term evolution (LTE) Band 28. Accordingly, it is noted that the performance of an antenna formed using a plating layer formed through the manufacturing method disclosed herein is an improvement over that of an antenna using an existing FPCB in a specific band.

Referring to FIG. 8, it is noted that in a low band of 1 GHz or less, the performance of an antenna formed through the manufacturing method disclosed herein is generally higher than that of an antenna using an FPCB. It is advantageous that the portion of the antenna from which an actual signal is radiated is spaced apart from other electronic components of the electronic device. In the manufacturing method disclosed herein, a plating layer may be formed on a housing (e.g., an injection-molded product) constituting the exterior of an electronic device to be used as an antenna. Since a plating layer is formed on the outer surface of the electronic device and is used as a radiator of an antenna, it is possible to obtain high antenna radiation efficiency.

Figure 9:
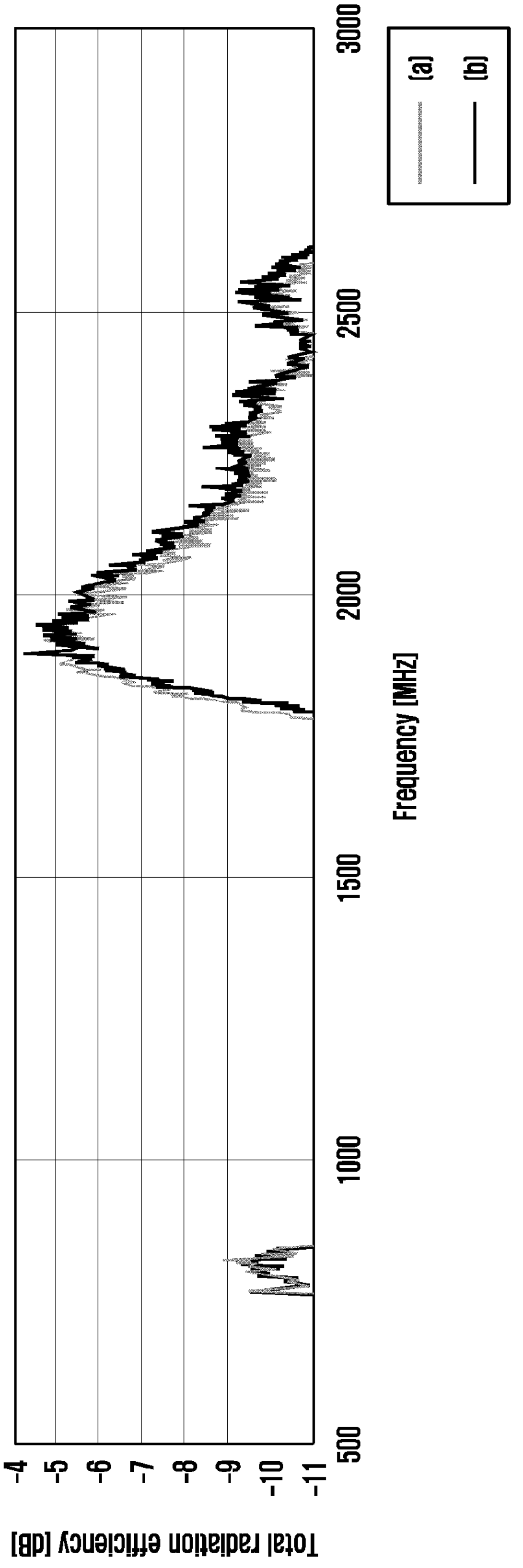
FIG. 9 is a graph showing, in comparison, performances of antennas depending on whether a coating layer was formed or not in a case in which plating layers formed according to various embodiments were used as the antennas.

FIG. 9 is a graph showing, in comparison, performances of antennas depending on whether a coating layer was formed or not in a case in which plating layers formed according to various embodiments disclosed herein were used as the antennas.

Graphs (a) and (b) of FIG. 9 both show performances of antennas formed by using plating layers formed through the manufacturing method disclosed herein. Graph (a) corresponds to a case in which a coating layer was formed, and graph (b) corresponds to a case in which a coating layer was not formed. Referring to FIG. 9, it is noted that the shapes of the graph (a) and the graph (b) are similar. Through this, it is noted that the performance of the plating layer is not significantly affected even when the coating layer is formed in the plating area where the plating layer is disposed.

Hereinafter, a manufacturing method of an electronic device according to an embodiment different from the above-described embodiment and an electronic device manufactured by the manufacturing method will be described with reference to FIG. 10 to FIGS. 10A, 10B, and 10C are views of a housing of an electronic device according to various embodiments disclosed herein. FIG. 11A is an enlarged view of a portion P1 in FIG. 10. FIG. 11B is an enlarged view of a portion P2 in FIG. 10.

According to various embodiments, a housing 1010 (e.g., the housing of FIGS. 2A and 2B) of an electronic device 1000 (e.g., the electronic device 101 in FIG. 1 or the electronic device 200 in FIGS. 3A-1 and 3A-2) may form at least a portion of the exterior of the electronic device 1000. The housing 1010 may be a component that accommodates and supports various electrical elements included in the electronic device 1000 (e.g., collectively referring to various devices including electronic components and conductive materials) and mechanical elements other than electrical elements. The shape of the housing 1010 is not limited to that illustrated in FIGS. 10A, 10B, and 10C. In addition, the housing 1010 may be manufactured through various methods. For example, the housing 1010 may be manufactured by manufacturing a plurality of components separately and coupling the components.

In an embodiment, the housing 1010 may include an outer surface 1010A and an inner surface 1010B. The inner surface 1010B of the housing 1010 may refer, for example, to a surface that accommodates or supports various electrical and/or mechanical elements accommodated in the housing 1010, and the outer surface 1010A of the housing 1010 is a surface opposite to the inner surface 1010B and may refer, for example, to a surface constituting a portion of the exterior of the electronic device 1000. According to various embodiments, a plating layer 1020 may be formed on the housing 1010.

Figure 10A:
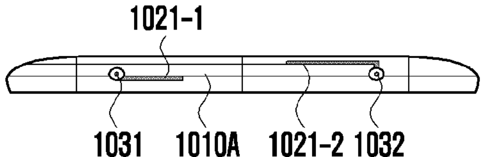
FIGS. 10A, 10B, and 10C are views illustrating a housing of an example electronic device according to various embodiments.
Figure 10B:
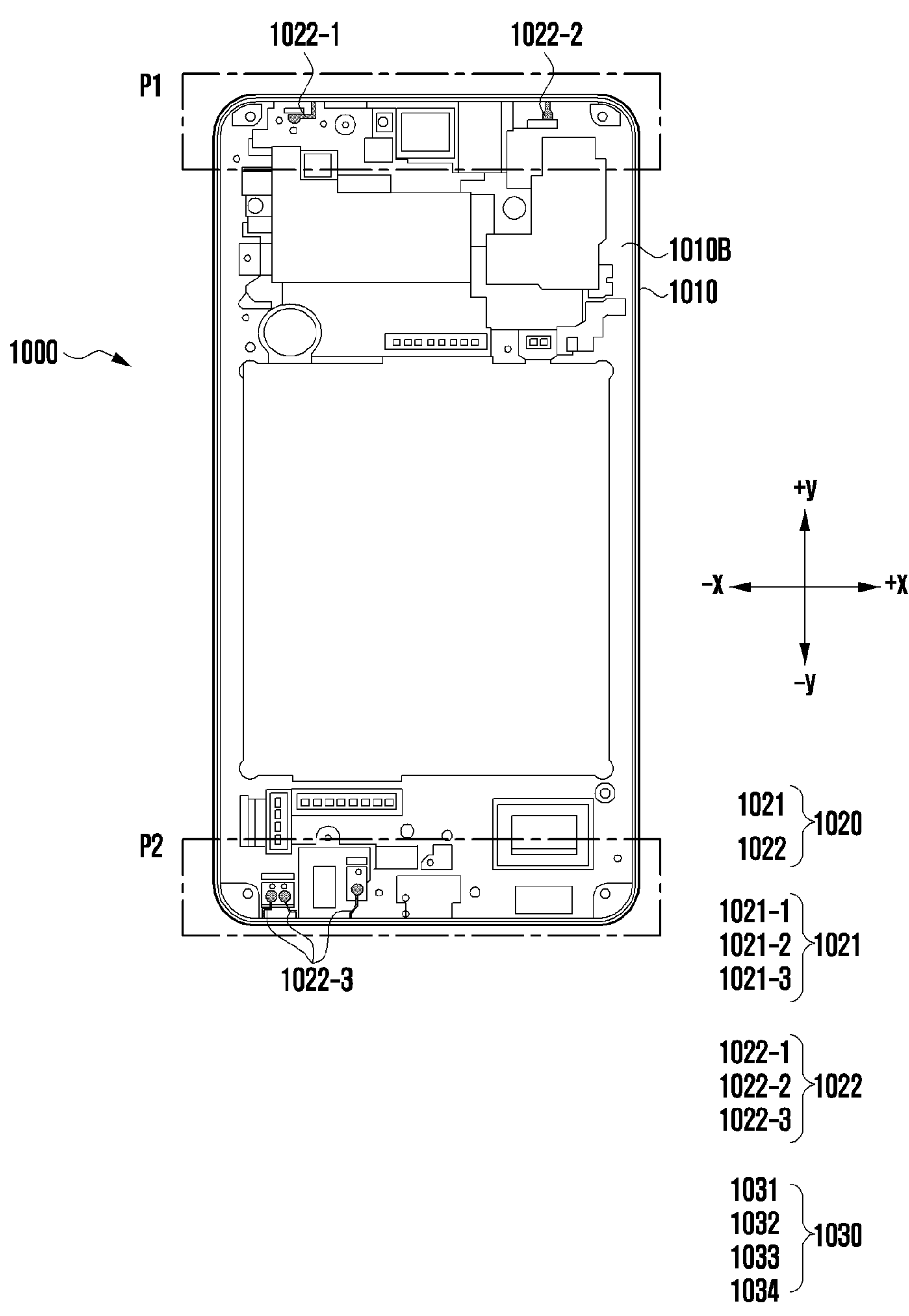
Figure 10C:
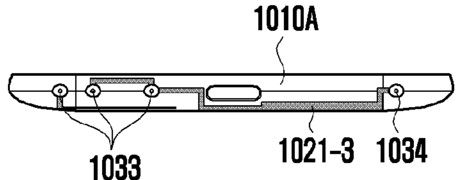
Figure 11A:
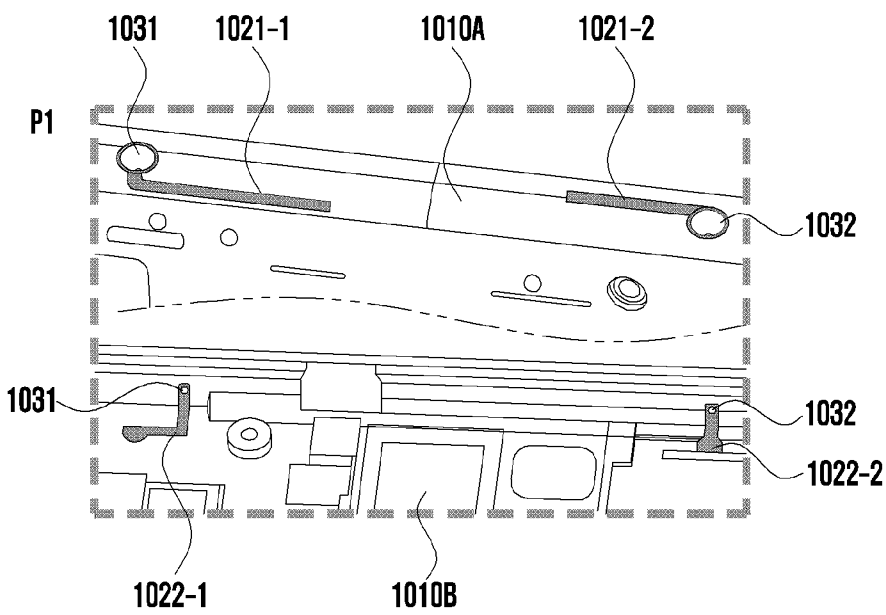
FIG. 11A is an enlarged view of a portion P1 in FIG. 10.
Figure 11B:
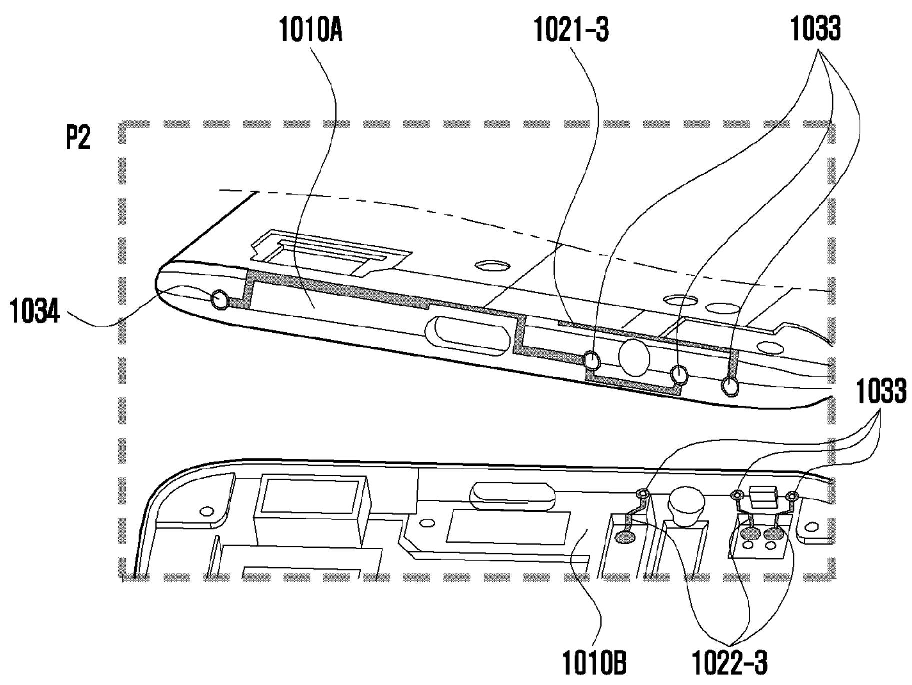
FIG. 11B is an enlarged view of a portion P2 in FIG. 10.

Referring to FIGS. 10A, 10B, 10C, 11A, and 11B, an outer plating layer 1021 may be disposed on the outer surface 1010A of the housing 1010. For example, at least a portion of the outer plating layer 1021 may be formed on the outer surface 1010A of the housing 1010 by a plating method. A process of forming the outer plating layer 1021 on the outer surface 1010A of the housing 1010 will be described below. For example, as illustrated in FIG. 10, the outer plating layer 1021 may be formed in a portion of the outer surface 1010A of the upper portion of the housing 1010 (e.g., the portion P1 in FIG. 10B) and the lower portion of the housing 1010 (e.g., the portion P2 in FIG. 10B). The exterior of the outer plating layer 1021 illustrated in FIGS. 10A, 10B, and 10C is only an example, and the position where the outer plating layer 1021 is formed is also an example. For example, as illustrated in FIGS. 2A-1 and 2A-2, the outer plating layer 1021 may be formed at a position spaced apart from the boundary portion between the first and second parts having different curvatures (e.g., the boundary portion 203 in FIGS. 2A-1 and 2A-2). The shape and position of the outer plating layer 1021 may be variously changed depending on the design of the electronic device 1000.

Referring to FIGS. 10A, 10B, 10C, 11A, and 11B, an inner plating layer 1022 may be disposed on the inner surface 1010B of the housing 1010. For example, the inner plating layer 1022 may be formed at least a portion of the inner surface 1010B of the housing 1010 by a plating method. A process of forming the inner plating layer 1022 on the inner surface 1010B of the housing 1010 will be described below. For example, as illustrated in FIGS. 10A, 10B, and 10C, the inner plating layer 1022 may be formed in a portion of the outer surface 1010A of the upper portion of the housing 1010 (e.g., the portion P1 in FIG. 10B) and the lower portion of the housing 1010 (e.g., the portion P2 in FIG. 10B). The exterior of the inner plating layer 1022 illustrated in FIG. 10 is only an example, and the position where the inner plating layer 1022 is formed is also an example. The shape and position of the inner plating layer 1022 may be variously changed depending on the design of the electronic device 1000.

According to various embodiments, holes 1030 may be formed in the housing 1010. The holes 1030 may be formed in a portion of the housing 1010. The holes 1030 may be formed in the housing 1010 by various methods. For example, when the housing 1010 is molded by an injection molding method, the housing 1010 may be manufactured using a mold configured to mold the housing 1010 and including portions for forming the holes 1030. In addition, the holes 1030 may be formed by perforating the housing 1010 using a separate processing body. In an embodiment, a connection plating layer (e.g., the connection plating layer 1023 of FIG. 12) may be disposed in each hole 1030. For example, the connection plating layer 1023 may be formed on the inner surface 1010B of each hole 1030 by a plating method. The connection plating layer 1023 formed on the inner surface 1010B of the hole 1030 connects an outer plating layer 1021 formed on the outer surface 1010A of the housing 1010 to an inner plating layer 1022 formed on the inner surface 1010B of the housing 1010.

According to various embodiments, the connection plating layer (e.g., the connection plating layer 1023 in FIG. 12) formed in the hole 1030 may connect the outer plating layer 1021 to the inner plating layer 1022. For example, as illustrated in FIG. 11A, a first outer plating layer 1021-1 may be connected to a first inner plating layer 1022-1 by a connection plating layer formed in a first hole 1031. A second outer plating layer 1021-2 may be connected to a second inner plating layer 1022-2 by a connection plating layer formed in a second hole 1032. In addition, referring to FIG. 11B, a third outer plating layer 1021-3 may be connected to a third inner plating layer 1022-3 by a connection plating layer formed in a third hole 1033. Although not visible in the drawings, a connection plating layer formed in a fourth hole 1034 may connect the third outer plating layer 1021-3 formed on the outer surface 1010A of the housing 1010 to the inner plating layer 1022 formed on the inner surface 1010B of the housing 1010. Here, the connection of the plating layer 1020 may refer, for example, to an electrical signal being transmitted via the plating layer 1020 through a physical connection of the plating layer 1020 (the connection includes a continuous connection). For example, when the outer plating layer 1021 is connected to the inner plating layer 1022 via the connection plating layer, an electrical signal transmitted to the inner plating layer 1022 may be transmitted to the outer plating layer 1021 via the connection plating layer.

According to various embodiments, the plating layer 1020 may be used as a component for the electronic device 1000 which requires transmission of electrical signals. For example, the plating layer 1020 may be used as an antenna for short-range and/or long-range communication of the electronic device 1000. In addition, the plating layer 1020 may be used as a wire that electrically interconnects various electronic components. Further, the plating layer may be variously used for a touch sensor for recognizing a capacitive touch input, a grip sensor, and the like (e.g., the plating layer 410 in FIG. 4). The aforementioned uses of the plating layer 1020 are only examples, and the plating layer 1020 may be used for various components that require transmission of electrical signals.

Figure 12:
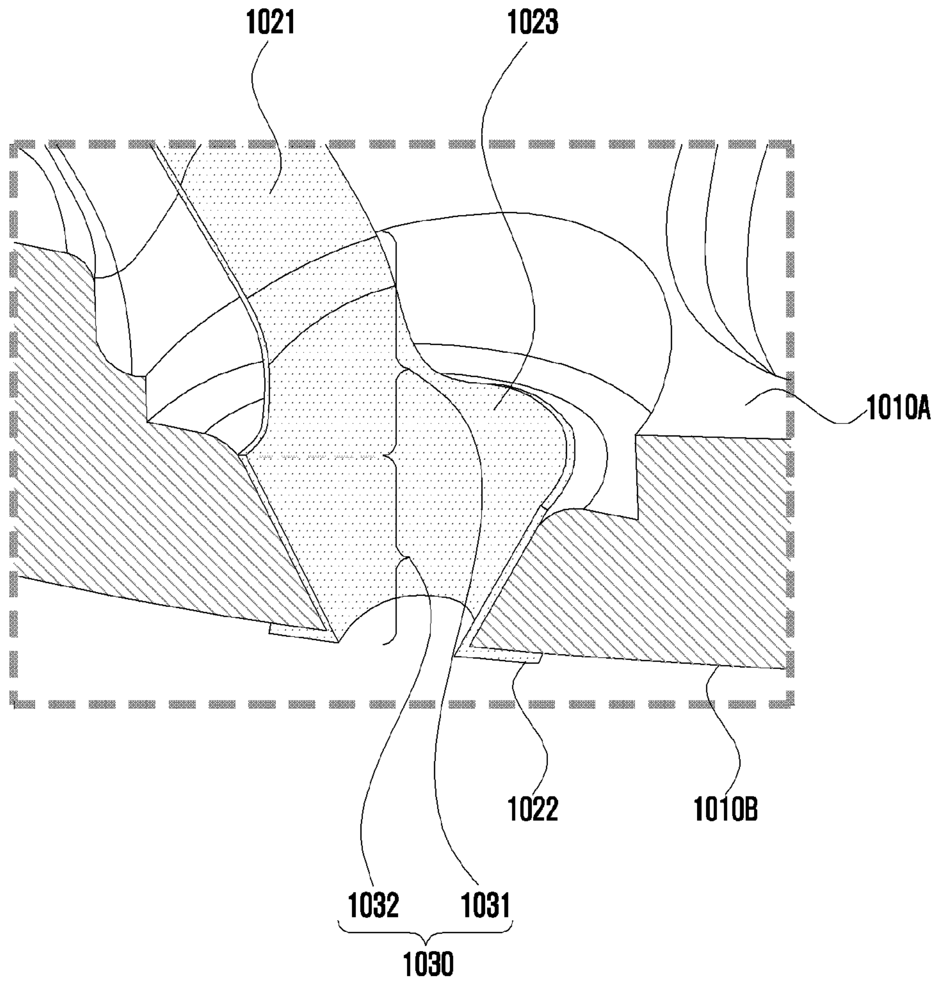
FIG. 12 is a cross-sectional view of a hole according to various embodiments in a state in which the hole is partially cut.
Figure 13A:
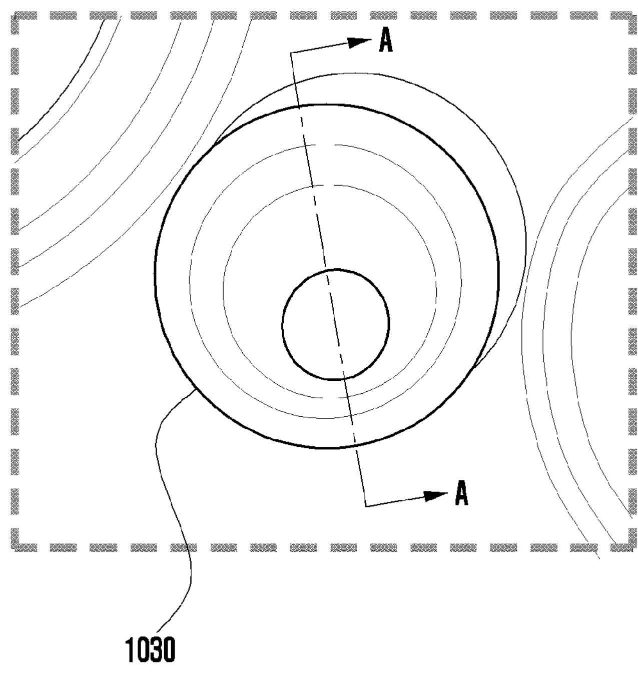
FIG. 13A is a view of a hole according to various embodiments viewed from one direction.
Figure 13B:
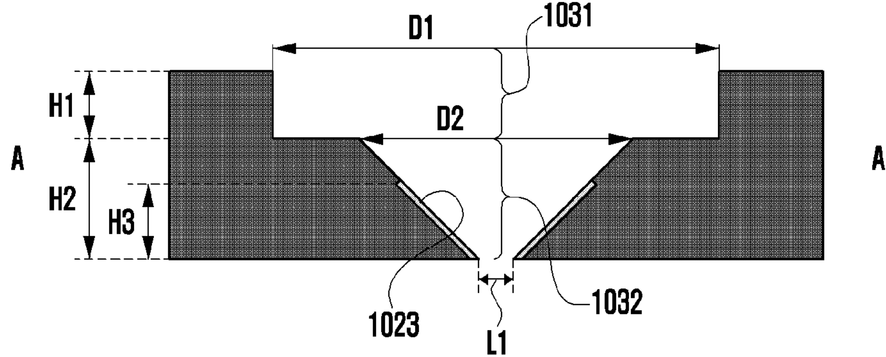
FIG. 13B is a cross-sectional view of the hole illustrated in FIG. 13A taken along line A-A.
Figure 13C:
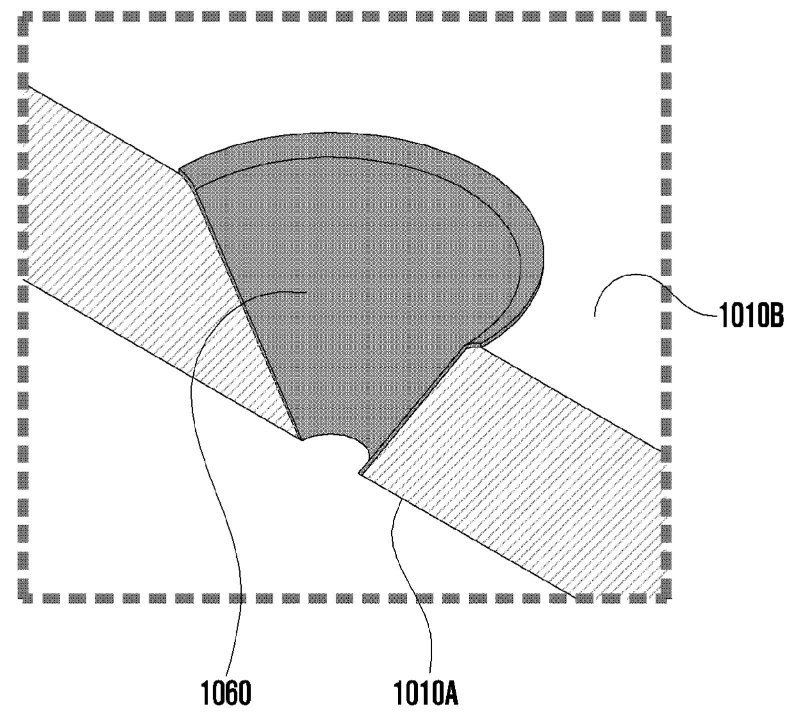
FIG. 13C is a perspective view of a hole according to various embodiments in a state in which the hole is partially cut.

FIG. 12 is a cross-sectional view of a hole according to various embodiments disclosed herein in a state in which the hole is partially cut. FIG. 13A is a view of a hole according to various embodiments disclosed herein viewed from one direction. FIG. 13B is a cross-sectional view of the hole illustrated in FIG. 13A taken along line A-A. FIG. 13C is a perspective view of a hole according to an embodiment disclosed herein in a state in which the hole is partially cut.

According to various embodiments, the hole 1030 may be formed in a housing (e.g., the housing 1010 in FIG. 10). A connection plating layer 1023 may be formed in a partial area of the inner surface of the hole 1030. As illustrated in FIG. 12, the connection plating layer 1023 formed on the inner surface of the hole 1030 connects an outer plating layer 1021 formed on the outer surface 1010A of the housing 1010 to an inner plating layer 1022 formed on the inner surface 1010B of the housing 1010.

According to various embodiments, the hole 1030 may include a first portion 1031 and a second portion 1032. Referring to FIGS. 12 and 13B, the first portion 1031 may be a portion adjacent to the outer surface 1010A of the housing 1010, and the second portion 1032 may be a portion adjacent to the inner surface 1010B of the housing 1010.

In an embodiment, the first portion 1031 may be a portion formed in a direction from the inner surface of the hole 1030 to the outer surface 1010A of the housing 1010. The first portion 1031 may have a first diameter D1. For example, the first diameter D1 may be about 1.5 mm to about 5.5 mm. The second portion 1032 may be a portion formed from an end of the first portion 1031 toward the inner surface 1010B of the housing 1010. The second portion 1032 may start with a second diameter D2 and gradually decrease in diameter toward the inner surface 1010B of the housing 1010. The height of the second portion 1032 (H2) may be about 20% to about 50% of the height of the entire hole 1030 (H1+H2).

In an embodiment, the height of the first portion 1031 (H1) may be different from the height of the second portion 1032 (H2). In an embodiment, the height of the first portion 1031 (H1) may be equal to the height of the second portion 1032 (H2).

In an embodiment, the second diameter D2 may be smaller than the first diameter D1. For example, the second diameter D2 may be about 1.0 mm to about 3.5 mm Since the first diameter D1 of the first portion 1031 and the second diameter D2, which is the diameter of the starting portion of the second portion 1032, are different from each other, as illustrated in FIG. 13B, a step difference may be formed between the first portion 1031 and the second portion 1032. The step difference may be a portion that allows the filler to be fixed and accommodated in the hole 1030 without passing through the hole 1030 when the filler is injected into the first portion 1031. In an embodiment, a third diameter L1, which is the diameter at the point where the second portion 1032 ends, may be smaller than the second diameter D2. For example, the third diameter L1 may be about 0.4 mm to about 0.8 mm.

In an embodiment, the connection plating layer 1023 may be formed in a portion of the hole 1030. The connection plating layer 1023 may be formed in a partial area of the inner surface of the hole 1030. For example, referring to FIG. 13B, the connection plating layer 1023 may be formed in a portion of the second portion 1032 of the inner surface of the hole 1030 or formed in the entire second portion 1032. In an embodiment, the height H3 of the portion where the connection plating layer 1023 is formed may be about 30% to 100% of the height H2 of the second portion 1032. Referring to FIG. 12, the connection plating layer 1023 may be formed in a portion of the first portion 1031 of the hole 1030. In this way, by forming the connection plating layer 1023 only in a portion of the hole 1030, a filler filled in the hole 1030 may come into direct contact with the inner wall of the hole 1030 through the portion where the connection plating layer 1023 is not formed. For example, when the filler and the housing 1010 are made of a synthetic resin material, the affinity between the filler and the housing 1010 may be relatively better than the affinity between the filler and the connection plating layer 1023. Therefore, when the filler comes into direct contact with the inner wall of the hole 1030, the filler may be more stably seated in the hole 1030 more than when the filler comes into contact with the connection plating layer 1023.

Referring to FIG. 13C, a hole 1060 may be formed in a shape in which its diameter varies along a direction from the inner surface 1010B to the outer surface 1010A of the housing. For example, as illustrated in FIG. 13C, the hole 1060 may be formed in a shape in which the diameter decreases from the inner surface 1010B toward the outer surface 1010A of the housing.

The shapes and dimensions of the holes 1030 and 1060 described above are merely examples, and the shapes and dimensions of the holes 1030 and 1060 may be variously changed depending on various design factors.

Next, a process of forming a plating layer on a housing will be described with reference to FIG. 14 and FIGS. 15A, 15B, and 15C.

Figure 14:
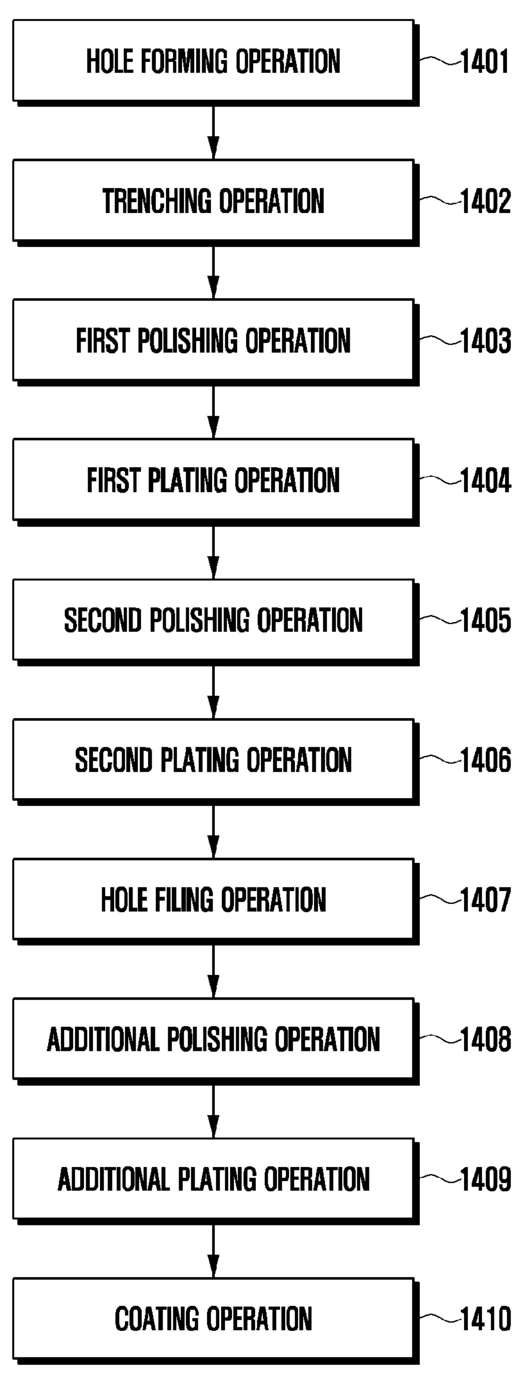
FIG. 14 is a flowchart of an example method of manufacturing an electronic device according to various embodiments.
Figure 15A:
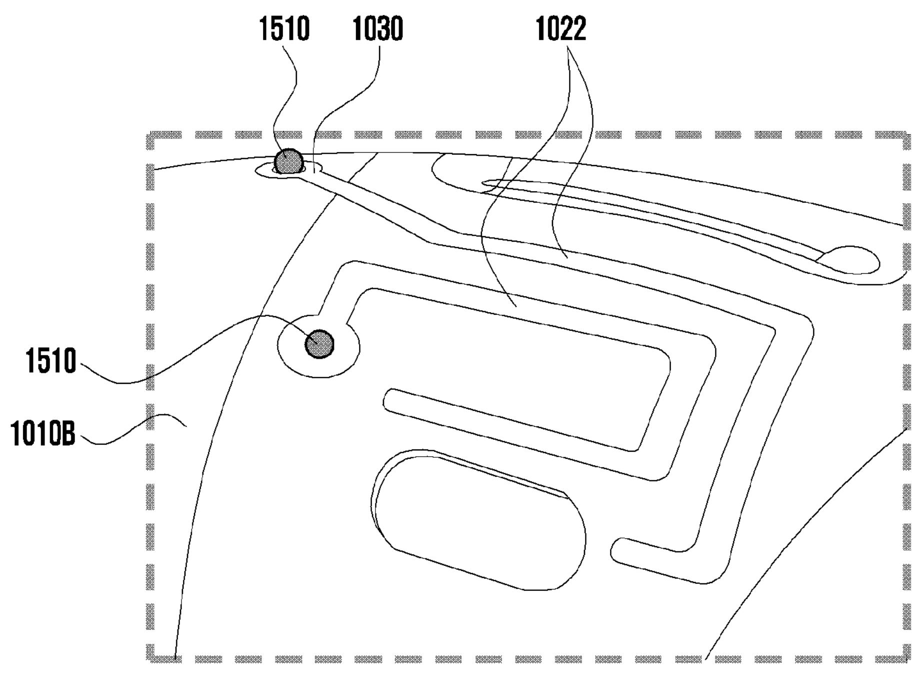
FIGS. 15A, 15B, and 15C are views illustrating states in which a plating layer is formed according to a manufacturing method of an example electronic device according to various embodiments.
Figure 15B:
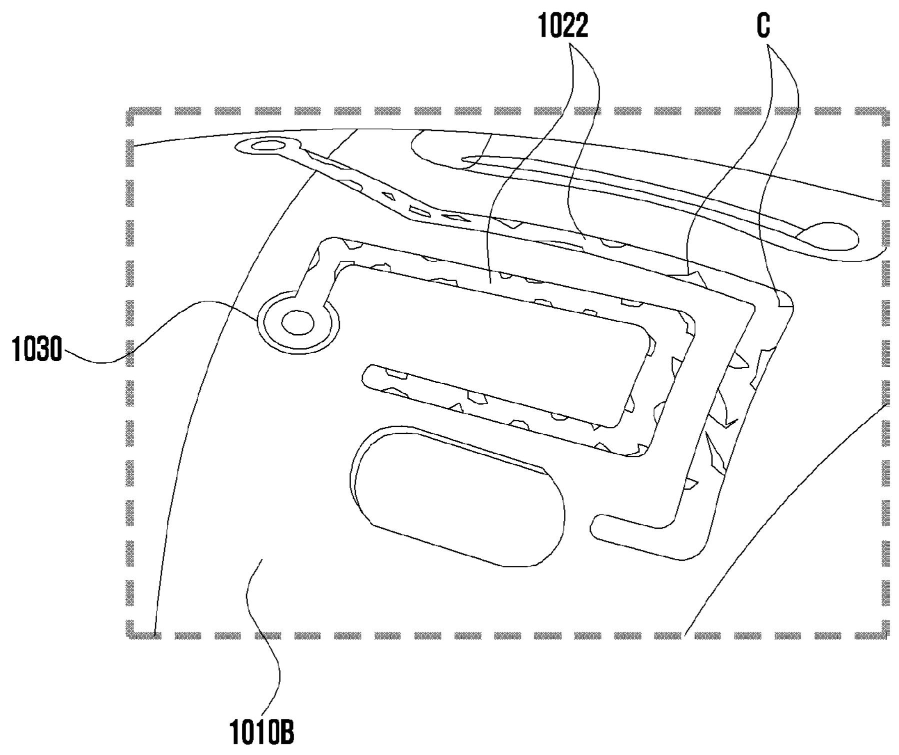
Figure 15C:
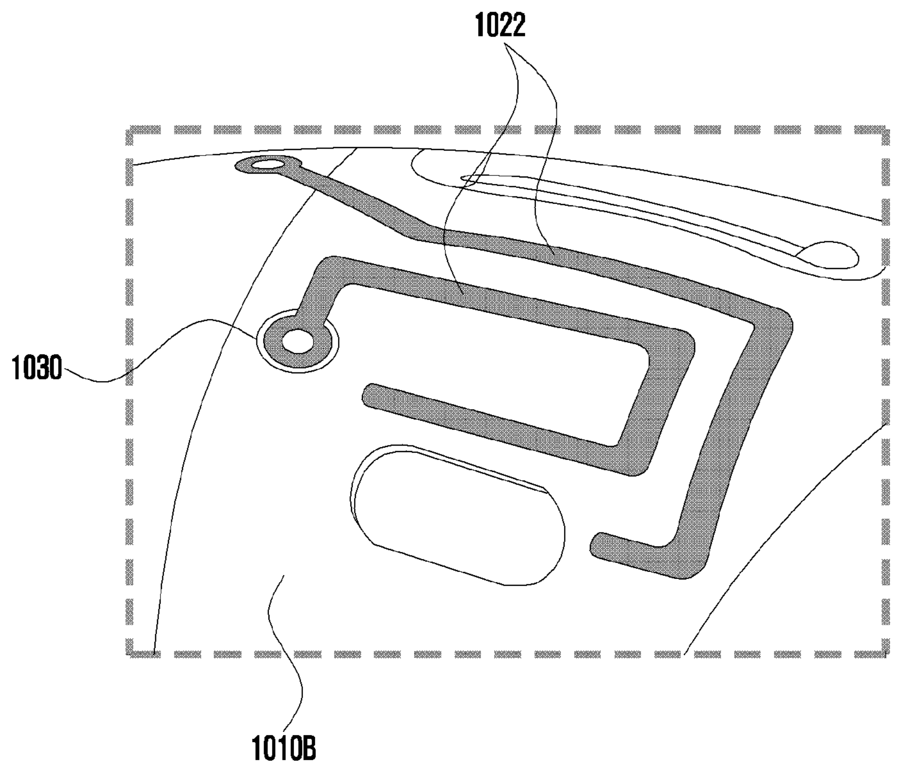

FIG. 14 is a flowchart of an example method of manufacturing an electronic device according to various embodiments disclosed herein. FIGS. 15A, 15B, and 15C are views illustrating states in which a plating layer is formed according to a manufacturing method of an electronic device according to various embodiments disclosed herein.

In the following description, a "plating area" is an area where plating is performed and may refer, for example, to a portion where the above-described plating layer 1020 is formed. Therefore, the first plating area to be described below may be understood as a portion where the above-described outer plating layer 1021 is formed, the second plating area may be understood as a portion where the above-described inner plating layer 1022 is formed, and the above-described third plating area may be understood as a portion where the above-described connection plating layer 1023 is formed. In the following description, the plating areas corresponding to those of the plating layer 1020 will be described using the same reference numbers as those of the plating layer. Reference will be made to FIGS. 10A, 10B, 10C, 11A and 11B for example positions of plating areas.

In the following description, the processes of forming the plating layer may be similar to those described above with reference to FIG. 5. Therefore, for a process similar to a process described with reference to FIG. 5, a detailed description thereof will not be repeated while indicating a description that "reference may be made to FIG. 5".

The flowchart of FIG. 14 is only an example. It is possible to omit some of the operations illustrated in FIG. 14 or to add other operations, and the sequence of operations may also be changed variously as needed.

According to various embodiments, a hole 1030 may be formed in a housing (e.g., the housing 1010 in FIG. 10) (operation 1401). The hole 1030 formed in the housing may be formed by various methods. For example, a housing having the hole 1030 may be manufactured by molding the housing by an injection molding method using a mold in which the hole 1030 is considered, and the hole 1030 may be formed in the housing using a processing body. In addition, the hole 1030 may be formed by various methods.

According to various embodiments, trenches (e.g., the trench 610 in FIG. 6A) may be formed in some areas of the housing (operation 1402). The trenches may refer, for example, to fine irregularities in which peaks (e.g., the peaks 611 in FIG. 6A) and valleys (e.g., the valleys 612 in FIG. 6A) are continuous. In the first plating operation 1404 to be described below, a plating layer (e.g., the plating layer 620 in FIG. 6D) may be formed in the portions where the trenches are formed. Accordingly, the trenches may be formed in a first plating area where a first plating layer 1021 is to be formed (e.g., the area where the first plating layer 1021 is formed in FIG. 10), a second plating area where a second plating layer 1022 is to be formed (e.g., the area where the second plating layer 1022 is formed in FIG. 10), and a third plating area where a connection plating layer 1023 is to be formed (e.g., the area where the connection plating layer 1023 is formed in FIG. 12). As described with reference to FIG. 12, the connection plating layer 1023 may be formed only in a partial area of the inner surface of the hole 1030. By forming a trench only in a partial area of the inner surface 1010B of the hole 1030, the connection plating layer 1023 may be formed only in a part of the inner surface of the hole 1030. For a more detailed description of the trenching operation 1402, reference may be made to FIG. 5.

According to various embodiments, a first polishing operation 1403 may be performed. The first polishing operation 1403 may be an operation of partially cutting the trenches. For example, the trenches formed in the first plating area, the second plating area, and the third plating area may be cut. The first polishing operation 1403 may be an operation provided considering the quality of a coating layer (e.g., the coating layer 670 in FIG. 6E) formed in the coating operation 1410. Therefore, the first polishing operation 1403 may be performed only in the first plating area where the coating layer is formed. For a more detailed description of the first polishing operation 1403, reference may be made to FIG. 5.

According to various embodiments, a first plating operation 1404 may be performed after the first polishing operation 1403. The first plating operation 1404 may be an operation of forming a first plating layer (e.g., the first plating layer 620 in FIG. 6D) including a first metal material in the first plating area, the second plating area, and the third plating area. The first plating layer formed in the plating area in the first plating operation 1404 may form a portion of the plating layer. For a more detailed description of the first plating operation 1404, reference may be made to FIG. 5.

According to various embodiments, a second polishing operation 1405 may be performed after the first plating operation 1404. The second polishing operation 1405 may be an operation of partially cutting the first plating layer formed in the first plating operation 1404. The second polishing operation 1405 may be an operation provided considering the quality of the coating layer. Therefore, the second polishing operation 1405 may be performed only in the first plating area where the coating layer is formed. For a more detailed description of the second polishing operation 1405, reference may be made to FIG. 5.

According to various embodiments, a second plating operation 1406 may be performed after the second polishing operation 1405. The second plating operation 1406 may be a plating operation of forming a second plating layer (e.g., the second plating layer 630 in FIG. 6E) including a second metal material in the plating area. The second plating operation 1406 may be a plating operation similar to the first plating operation 1404. For a more detailed description of the second plating operation 1406, reference may be made to FIG. 5 which was referred to when describing the first plating operation 1404.

According to various embodiments, a hole filling operation 1407 may be performed after the second plating operation 1406. The hole filling operation 1407 may be an operation of filling the hole 1030 with a filler. The filler may be a synthetic resin material. For example, the filler may be a light-curable resin (e.g., a UV resin). The filler may fill the hole 1030 in various methods. For example, the filling material may be filled in the hole 1030 using various devices capable of injecting molten liquid to a specific location, such as a dispensing device, a pumping device, and a jet pumping device. In an embodiment, a filler may be injected into a first portion (e.g., the first portion 1031 in FIG. 12) of the hole 1030. As illustrated in FIG. 15A, the filler injected into the first portion 1031 may partially form protrusions 1510 protruding to the outer surface 1010A of the housing 1010 through a second portion (e.g., the second portion 1032 in FIG. 12). According to various embodiments, a post-processing operation including a process of curing the filler may be performed after the filler is filled. Various methods may be used depending on the type of the filler. A post-processing operation of curing the filler by using light, heat, a catalyst, or the like may be performed.

According to various embodiments, an additional polishing operation 1408 may be performed after the hole filling operation 1407. The additional polishing operation 1408 may be an operation of removing the protrusions 1510 of the filler partially protruding to the outer surface 1010A of the housing 1010 by the preceding hole filling operation 1407. Referring to FIG. 15B, the protrusions 1510 of the filler may be removed by the additional polishing operation 1408. In this case, defects C may be formed in a portion of the plating layer formed in the first plating area 1021 of the outer surface 1010A of the housing 1010. This may make the surface of the plating layer in the first plating area 1021 nonuniform.

According to various embodiments, an additional plating operation 1409 may be performed after the additional polishing operation 1408. The additional plating operation 1409 may be a plating operation for compensating for the defects C formed on the surface of the plating layer of the first plating area 1021 in the additional polishing operation 1408. A new plating layer may be formed on the surface of the coating layer of the first coating area 1021 by the additional coating operation 1409. Therefore, as illustrated in FIG. 15C, surface uniformity of the plating layer of the first plating area 1021 may be improved.

According to various embodiments, a coating operation 1410 may be performed after the additional plating operation 1409. The coating operation 1410 may be an operation of forming a coating layer on at least a portion of the outer surface 1010A of the housing 1010. Referring to FIG. 6E, the first plating area 1021 may be covered by the coating layer formed on the outer surface 1010A of the housing 1010. In various embodiments disclosed herein, the surface uniformity of the outer surface 1010A of the housing 1010 may be improved through the polishing operations (e.g., the first polishing operation 1403, the second polishing operation 1405, and the additional polishing operation 1408) and the hole 1030 filling operation 1407. By forming the coating layer on the uniform outer surface 1010A of the housing 1010 as described above, it is possible to improve the quality of the coating layer. For a more detailed description of the coating operation 1410, reference may be made to FIG. 5.

In an example embodiment, a housing (e.g., the housing 201 in FIG. 2A) of an electronic device (e.g., the electronic device 200 in FIG. 3A) may include a body (e.g., the body 2011 in FIG. 2A) that includes a first portion (e.g., the first portion 201-1 in FIG. 2A) having a first curvature and a second portion (e.g., the second portion 201-2 in FIG. 2A) having a second curvature, an outer plating layer (e.g., the outer plating layer 210 in FIG. 2A) including a conductive material and disposed on an outer surface of the body to be spaced apart by a predetermined interval from a boundary portion (e.g., the boundary portion 203 in FIG. 2A), which is the boundary between the first portion and the second portion, and a coating layer (e.g., the coating layer 670 in FIG. 6E) disposed on the outer surface of the body to cover the plating layer.

In an example embodiments, the body may include a trench (e.g., the trench 610 in FIG. 6B) that includes a valley (e.g., the valleys 612 in FIG. 6E) which is concave with respect to the outer surface of the body, a peak (e.g., the peaks 611 in FIG. 6E) which is convex with respect to the outer surface of the body, and a processed portion (e.g., the processed portions 611-1 in FIG. 6E) obtained by removing a portion of the peak, and the outer plating layer may be disposed in the trench.

In an example embodiment, the processed portion may be a portion obtained by removing a portion of the peak such that a surface of the processed portion is substantially parallel to the surface of the body.

In an example embodiment, the outer plating layer may include a first sub-plating layer (e.g., the first sub-plating layer 210-1 in FIG. 2A) disposed to be spaced apart from the boundary portion by a first distance, and a second sub-plating layer (e.g., the second sub-plating layer 210-2 in FIG. 2A) spaced apart from the boundary portion by a second distance different from the first distance.

In an example embodiment, the housing may further include an inner plating layer (e.g., the inner plating layer 1022 in FIG. 10) disposed on an inner surface of the body and including a conductive material.

In an example embodiment, the housing may further include a hole (e.g., the hole 1060 in FIG. 13C) provided in the body and a connection plating layer (e.g., the connection plating layer 1023 in FIG. 10) disposed in the hole and including a conductive material, and the connection plating layer may connect the outer plating layer to the inner plating layer.

In an example embodiment, the housing may further include a filler disposed in the hole to fill the hole.

In an example embodiment, the hole may have a diameter that varies along a direction from the outer surface toward the inner surface of the body.

In an example embodiment, the hole may have a diameter that becomes smaller from the outer surface toward the inner surface of the body.

In an example embodiment, the coating layer may include a compensation layer (e.g., the compensation layer 640 in FIG. 6E) configured to compensate for a step difference between a portion where the outer plating layer is disposed and a portion where the outer plating layer is not disposed, a color layer (e.g., the color layer 650 in FIG. 6E) having a color, and a protective layer (e.g., the protective layer 660 in FIG. 6E) laminated on the color layer.

In an example embodiment, an electronic device (e.g., the electronic device 200 in FIG. 3A) disclosed herein may include a housing (e.g., the housing 201 in FIG. 2A) including a body (e.g., the body 2011 in FIG. 2A) that includes a first portion (e.g., the first portion 201-1 in FIG. 2A) having a first curvature and a second portion (e.g., the second portion 201-2 in FIG. 2A) having a second curvature, an outer plating layer (e.g., the outer plating layer 210 in FIG. 2A) including a conductive material and disposed on an outer surface of the body to be spaced apart by a predetermined interval from a boundary portion (e.g., the boundary portion 203 in FIG. 2A), which is the boundary between the first portion and the second portion, and a coating layer (e.g., the coating layer 670 in FIG. 6E) disposed on the outer surface of the body to cover the plating layer.

In an example embodiment, the body may include a trench (e.g., the trench 610 in FIG. 6B) that includes a valley (e.g., the valleys 612 in FIG. 6E) which is concave with respect to the outer surface of the body, a peak (e.g., the peaks 611 in FIG. 6E) which is convex with respect to the outer surface of the body, and a processed portion (e.g., the processed portions 611-1 in FIG. 6E) obtained by removing a portion of the peak, and the outer plating layer may be disposed in the trench.

In an example embodiment, the processed portion may be a portion obtained by removing a portion of the peak such that a surface of the processed portion is substantially parallel to the surface of the body.

In an example embodiment, the outer plating layer may include a first sub-plating layer (e.g., the first sub-plating layer 210-1 in FIG. 2A) disposed to be spaced apart from the boundary portion by a first distance, and a second sub-plating layer (e.g., the second sub-plating layer 210-2 in FIG. 2A) spaced apart from the boundary portion by a second distance different from the first distance.

In an example embodiment, the electronic device may further include an inner plating layer (e.g., the inner plating layer 1022 in FIG. 10) disposed on the inner surface of the body and including a conductive material.

In an example embodiment, the electronic device may further include a hole (e.g., the hole 1060 in FIG. 13C) provided in the body and a connection plating layer (e.g., the connection plating layer 1023 in FIG. 10) disposed in the hole and including a conductive material, and the connection plating layer may connect the outer plating layer to the inner plating layer.

In an example embodiment, the housing may further include a filler disposed in the hole to fill the hole.

In an example embodiment, the hole may have a diameter that varies along a direction from the outer surface toward the inner surface of the body.

In an example embodiment, the hole may have a diameter that becomes smaller from the outer surface toward the inner surface of the body.

In an example embodiment, the coating layer may include a compensation layer (e.g., the compensation layer 640 in FIG. 6E) configured to compensate for a step difference between a portion where the outer plating layer is disposed and a portion where the outer plating layer is not disposed, a color layer (e.g., the color layer 650 in FIG. 6E) having a color, and a protective layer (e.g., the protective layer 660 in FIG. 6E) laminated on the color layer.

The embodiments disclosed in the specification and drawings are provided merely to easily describe the technical features according to the embodiments disclosed herein and to help understanding of the embodiments disclosed herein and are not intended to limit the scope of the embodiments disclosed herein. Therefore, the scope of the various embodiments disclosed herein should be construed as including, in addition to the embodiments disclosed herein, all changes or modifications derived based on the technical ideas of the various embodiments disclosed herein.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

a housing at least partially forming an exterior of the electronic device, the housing comprising:

a body comprising a first portion having a first curvature and a second portion having a second curvature different from the first curvature, and having an outer surface on which a trench is formed, the trench; comprising:

a valley that is concave with respect to the outer surface of the body, and a peak that is convex with respect to the outer surface of the body, the peak of the trench including a truncated portion obtained by removing a portion of the peak, an outer plating layer comprising a conductive material and disposed in the trench of the body to be spaced apart by a predetermined interval from a boundary between the first portion and the second portion; and a coating layer disposed on the outer surface of the body to cover the outer plating layer.

2. The electronic device of claim 1, wherein a surface of the truncated portion is substantially parallel to the outer surface of the body.

3. The electronic device of claim 1, wherein the outer plating layer comprises a first sub-plating layer disposed to be spaced apart from the boundary by a first distance, and a second sub-plating layer spaced apart from the boundary by a second distance different from the first distance.

4. The electronic device of claim 1, further comprising an inner plating layer disposed on an inner surface of the body and comprising a conductive material.

5. The electronic device of claim 4, further comprising:

a hole provided at the body; and a connection plating layer disposed in the hole and including a conductive material, wherein the connection plating layer connects the outer plating layer to the inner plating layer.

6. The electronic device of claim 5, further comprising a filler disposed in the hole to fill the hole.

7. The electronic device of claim 5, wherein the hole has a diameter that varies along a direction from the outer surface toward the inner surface of the body.

8. The electronic device of claim 5, wherein the hole has a diameter that becomes smaller along a direction from the outer surface toward the inner surface of the body.

9. The electronic device of claim 1, wherein the coating layer comprises a compensation layer configured to compensate for a step difference between a portion where the outer plating layer is disposed and a portion where the outer plating layer is not disposed, a color layer, and a protective layer laminated on the color layer.

10. A housing of an electronic device, the housing comprising:

a body comprising a first portion having a first curvature and a second portion having a second curvature different from the first curvature, and having an outer surface on which a trench is formed, the trench comprising:

a valley which is concave with respect to the outer surface of the body, and a peak which is convex with respect to the outer surface of the body, the peak of the trench including a truncated portion obtained by removing a portion of the peak, an outer plating layer comprising a conductive material and disposed in the trench of the body to be spaced apart by a predetermined interval from a boundary between the first portion and the second portion; and a coating layer disposed on the outer surface of the body to cover the outer plating layer.

11. The housing of claim 10, wherein the outer plating layer comprises a first sub-plating layer disposed to be spaced apart from the boundary by a first distance, and a second sub-plating layer spaced apart from the boundary by a second distance different from the first distance.

12. The housing of claim 10, further comprising:

an inner plating layer disposed on an inner surface of the body and comprising a conductive material;

a hole provided in the body; and a connection plating layer disposed in the hole and including a conductive material, wherein the connection plating layer connects the outer plating layer to the inner plating layer.

13. The housing of claim 12, wherein the hole has a diameter that varies along a direction from the outer surface toward the inner surface of the body.

14. The electronic device of claim 1, wherein the truncated portion has a surface substantially parallel to the outer surface of the body adjacent the trench.

* * * * *